(12) United States Patent  (10) Patent No.: US 7,531,781 B2
Sumi et al.  (45) Date of Patent: May 12, 2009

(54) IMAGER WITH IMAGE-TAKING PORTIONS OPTIMIZED TO DETECT SEPARATED WAVELENGTH COMPONENTS

(75) Inventors: Hirofumi Sumi, Kanagawa (JP); Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/358,885

(22) Filed: Feb. 21, 2006

(65) Prior Publication Data

US 2007/0051876 A1  Mar. 8, 2007

(30) Foreign Application Priority Data

Feb. 25, 2005  (JP) .......................... P2005-050212

(51) Int. Cl.
*H01L 31/00* (2006.01)
(52) U.S. Cl. .................. 250/208.1; 250/214.1; 438/69; 257/432; 257/440
(58) Field of Classification Search ............ 250/339.01, 250/339.02, 339.05, 208.1, 214.1; 438/69; 257/432, 440
See application file for complete search history.

(56) References Cited

U.S. PATENT DOCUMENTS

| | | | | |
|---|---|---|---|---|
| 4,957,371 A | * | 9/1990 | Pellicori et al. | ............. 356/419 |
| 5,910,816 A | * | 6/1999 | Fontenot et al. | ............... 348/65 |
| 6,013,912 A | * | 1/2000 | Pautrat et al. | ............... 250/226 |
| 6,082,858 A | * | 7/2000 | Grace et al. | .................. 351/200 |
| 6,794,219 B1 | * | 9/2004 | Stevens et al. | ................. 438/75 |
| 7,138,619 B1 | * | 11/2006 | Ferrante et al. | ............. 250/216 |
| 2004/0125222 A1 | * | 7/2004 | Bradski et al. | ............. 348/272 |
| 2006/0091284 A1 | * | 5/2006 | Viens et al. | ............... 250/201.9 |
| 2006/0114551 A1 | * | 6/2006 | Okada et al. | ................. 359/350 |

FOREIGN PATENT DOCUMENTS

| | | |
|---|---|---|
| JP | 06-121325 | 4/1994 |
| JP | 09-130678 | 5/1997 |
| JP | 09-166493 | 6/1997 |
| JP | 10-210486 | 8/1998 |
| JP | 2002-142228 | 5/2002 |
| JP | 2002-369049 | 12/2002 |
| JP | 2004-103964 | 4/2004 |

* cited by examiner

*Primary Examiner*—Seung C Sohn
(74) *Attorney, Agent, or Firm*—Robert J. Depke; Rockey, Depke & Lyons, LLC

(57) ABSTRACT

An imager having superior separation properties is provided in which a visible image and an infrared image can be independently and simultaneously obtained. The above imager has a wavelength separation portion of separating an electromagnetic wave carrying an image into wavelengths, and image-taking portions detecting the visible image and the infrared image described above. In the imager described above, at least one of the image-taking portions has a detecting part which is optimized to detect a wavelength component which is to be detected.

20 Claims, 22 Drawing Sheets

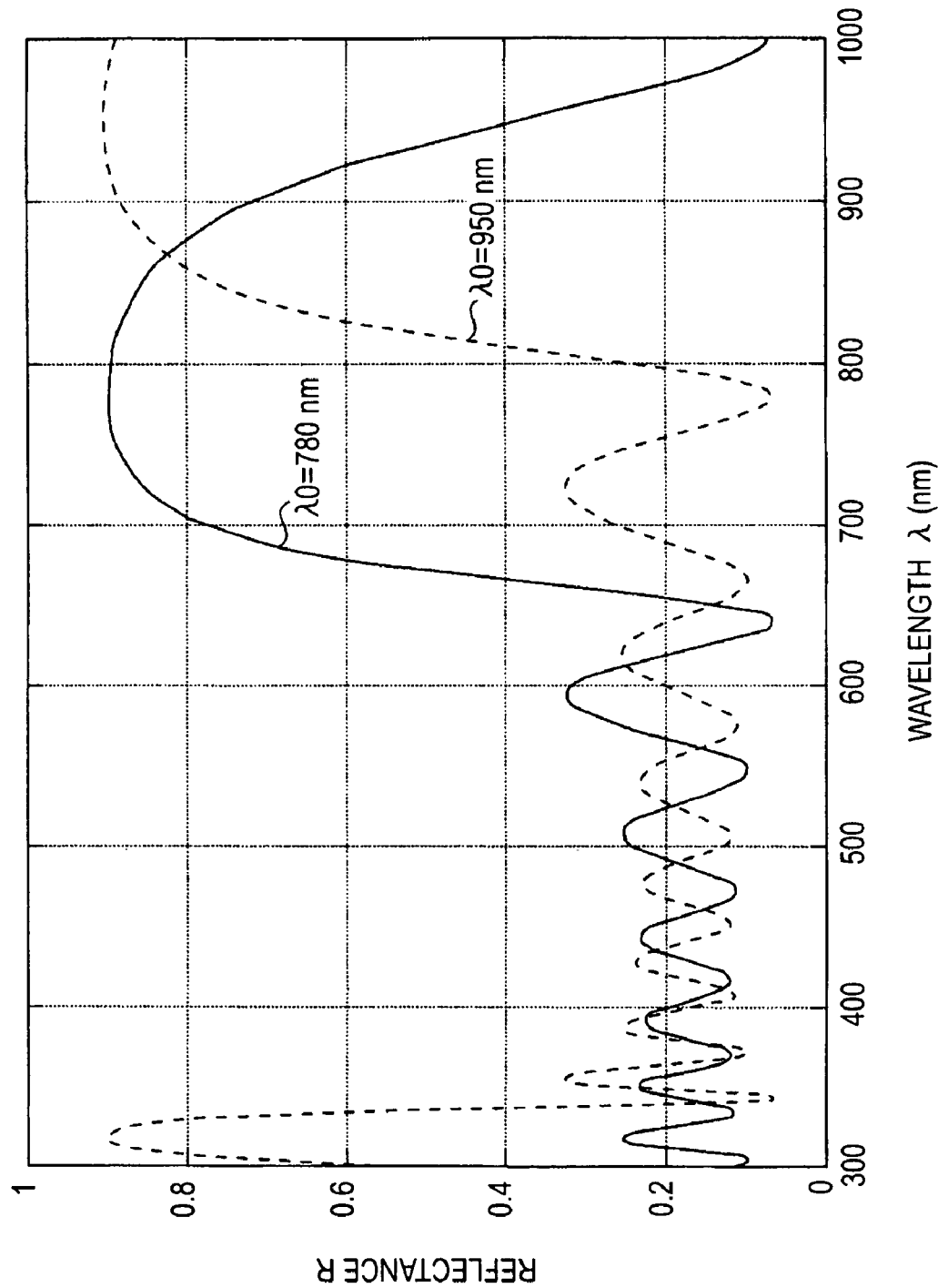

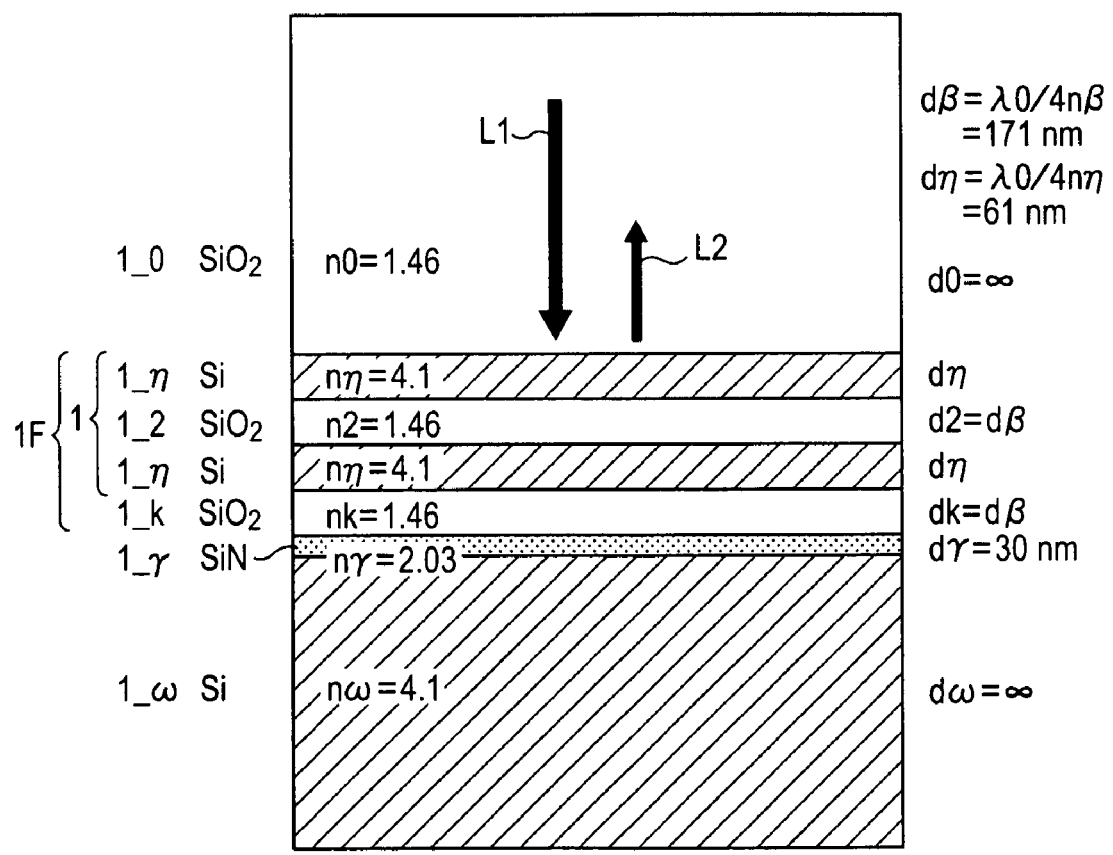

DETAILS OF 112_IR+VL (ONE PIXEL)

FIG. 21A
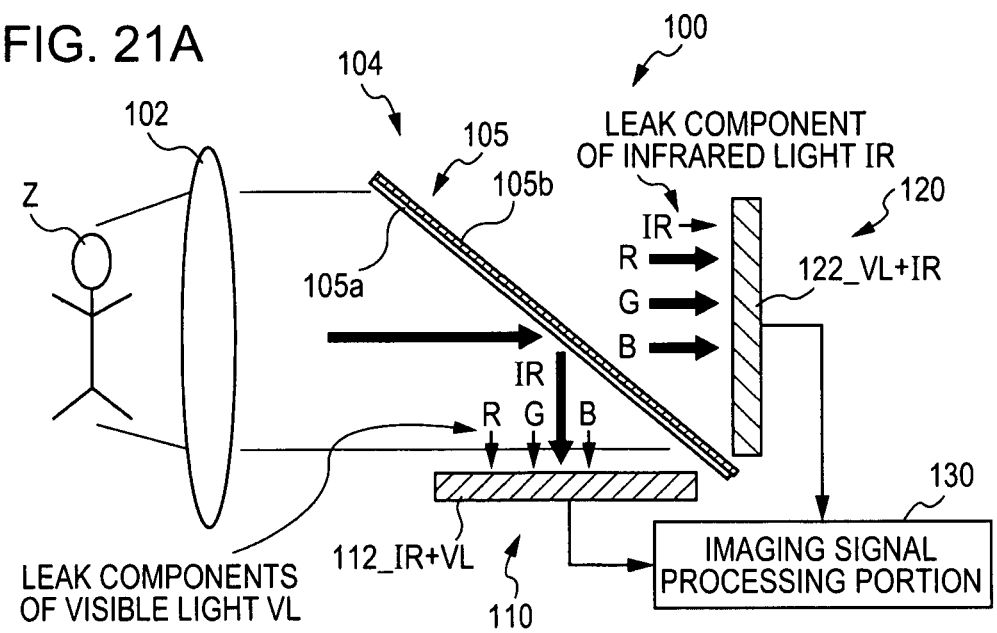
FIG. 21B DETAILS OF 112_IR+VL (ONE PIXEL)
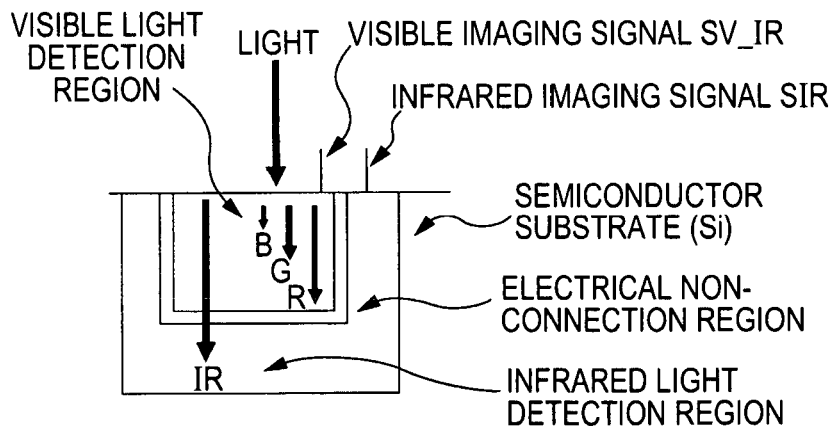
FIG. 21C DETAILS OF 122_VL+IR (ONE PIXEL)
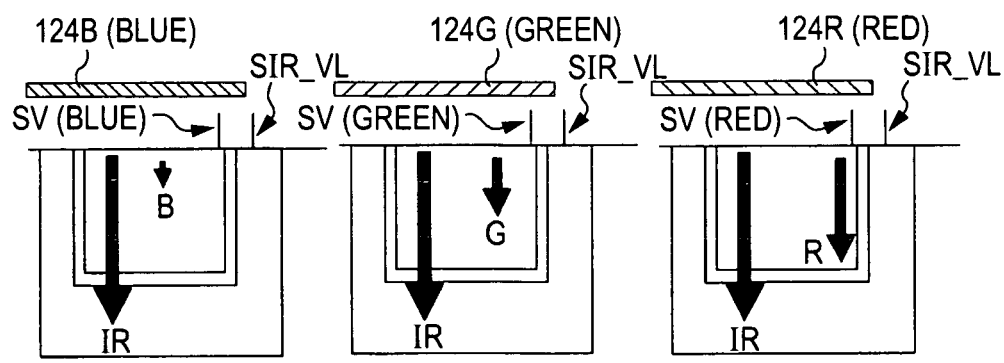

LIGHT ABSORPTION SPECTRUM OF SEMICONDUCTOR

LIGHT ABSORPTION OF SEMICONDUCTOR
(DEPTH DIRECTION)

IMAGER WITH IMAGE-TAKING PORTIONS OPTIMIZED TO DETECT SEPARATED WAVELENGTH COMPONENTS

CROSS REFERENCES TO RELATED APPLICATIONS

The present invention contains subject matter related to Japanese Patent Application JP 2005-050212 filed in the Japanese Patent Office on Feb. 25, 2005, the entire contents of which are incorporated herein by reference.

BACKGROUND OF THE INVENTION

1. Field of the Invention

The present invention relates to an imager. The imager includes a chip type, a package type, or a module type imaging device and a camera. In more particular, the present invention relates to a signal acquisition technique suitably applied, for example, to a solid-state imaging device using a semiconductor device capable of detecting and reading a physical value distribution in the form of electrical signals. In the above semiconductor device, unit constituent elements which have sensitivity to an electromagnetic wave, such as light or radioactive rays, input from the outside are arranged, and the physical value distribution is converted into the electrical signals by the unit constituent elements.

In particular, the present invention relates to the structure in which images of respective wavelength components are independently obtained, that is, for example, an image of a visible light component and an image of a wavelength component (such as infrared light) other than visible light are independently obtained.

2. Description of the Related Art

A semiconductor device for detecting a physical value distribution has been used in various fields, the semiconductor device having a plurality of unit constituent elements (such as pixels) arranged in lines or in a matrix, each of which has sensitivity to the change in physical value including electromagnetic waves, such as light or radioactive rays, input from the outside.

For example, in the filed of imaging apparatuses, a charge coupled device (CCD) type, a metal oxide semiconductor (MOS) type, and a complementary metal-oxide semiconductor (CMOS) type solid-state imaging device have been used for detecting the change in light (one type of electromagnetic wave) which is one example of a physical value. The devices read a physical value distribution in the form of electrical signals which are obtained through conversion of the above distribution by unit constituent elements (pixels in a solid-state imaging device).

For example, in a solid-state imaging device, photodiodes used as a photoelectric transducer (light-receiving element; photosensor) provided in an image-taking portion (pixel portion) of a device detect an electromagnetic wave, such as light or radioactive rays, input from the outside so as to generate and store signal charges, and the signal charges (photoelectrons) thus stored are read as image information.

In addition, in recent years, the structure for taking an image of visible light and an image of infrared light has been proposed (for example, see Japanese Unexamined Patent Application Publication Nos. 2004-103964, 10-210486, 2002-369049, 06-121325, 09-166493, 09-130678, and 2002-142228). For example, when a light-emitting point of infrared light is prepared beforehand and is then traced, the position of the light-emitting point of infrared light present in a visible image can be detected. In addition, even in the state in which visible light is not present such as in the night, when image-taking is performed while infrared light is irradiated, a clear image can be obtained. Furthermore, the sensitivity can be improved when infrared light is used in addition to visible light.

The structure described in Japanese Unexamined Patent Application Publication No. 2004-103964 is a single-plate system in which a visible image and an infrared image are separately obtained by exploiting the difference in position of light absorption in the depth direction of a semiconductor between wavelengths.

In addition, the structure described in Japanese Unexamined Patent Application Publication Nos. 10-210486, 2002-369049, and 06-121325 is a multiple plate system in which visible light and infrared light are separately received by respective imaging devices using a wavelength separation optical system such as a wavelength separation mirror or prism as an incident optical system.

For example, in Japanese Unexamined Patent Application Publication No. 10-210486, infrared light emitted from an infrared irradiation device is irradiated to an object, and at the same time, in an image-taking portion, an infrared component of light from the object is reflected on a cold mirror and is made incident on one sensor. In addition, a visible light component passing through the cold mirror is further separated into a red color component, a green color component, and a blue color component by three dichroic mirrors, and the above components are then made incident on respective sensors. The visible light side has the structure similar to that of a related three-plate system, that is, wavelength separation is performed in a wavelength region including R, G, and B colors to obtain respective sensitivities, so that an image is formed. As a result, three sensors are necessary and the cost is increased thereby; however, since the pixel size can be increased, the sensitivity can be improved.

In addition, in Japanese Unexamined Patent Application Publication No. 2002-369049, an iris diaphragm is provided for an image-taking lens system, an optical filter which only transmits light having a wavelength of approximately 770 to 950 nm (infrared wavelength region) is used as a blade of the iris diaphragm, and visible light and infrared light are further separated from each other by a dichroic mirror. In addition, an infrared-cut filter is provided at the transmitted visible light side, and a visible light-cut filter is provided at the reflected infrared light side. That is, after the wavelength separation is performed twice on a light path, the visible light and the infrared light are then made incident on respective sensors so as to separately obtain a visible image and an infrared image. The reason the diaphragm portion is formed to have a function of absorbing (or reflecting) infrared light is that the structure is formed to be used in three-dimensional measurement application.

In addition, the structure described in Japanese Unexamined Patent Application Publication No. 09-166493 is a single-plate system in which a rotary type wavelength separation optical system is used as an incident optical system and in which visible light and infrared light are received by the same imaging device. For example, in this structure, insertion and extraction of an infrared-cut filter is performed using a rotation mechanism, so that when the infrared-cut filter is inserted, a visible color image is output which is not influenced by near-infrared light and infrared light, and when the infrared-cut filter is extracted, an image is output which is obtained by adding the light intensity of visible light and that of near-infrared light.

In addition, the structure described in Japanese Unexamined Patent Application Publication No. 09-130678 is that visible light and infrared light are received by the same imaging device using a diaphragm optical system having a wavelength separation function as an incident optical system.

According to the structure described in Japanese Unexamined Patent Application Publication No. 2002-142228, four types of color filters each having its own filter characteristic are regularly provided for respective pixels of an imaging device having visible light and near-infrared light sensitivities, and matrix calculation of outputs of the pixels provided with the four types of color filters is performed, so that a visible color image and a near-infrared image can be independently obtained.

SUMMARY OF THE INVENTION

FIGS. 23A and 23B are views each illustrating the structure of the sensor described in Japanese Unexamined Patent Application Publication No. 2004-103964, FIG. 23A is a graph showing optical absorption spectral characteristics of a semiconductor layer, and FIG. 23B is a schematic cross-sectional view of the structure of a semiconductor.

In this structure, the optical absorption coefficient of a silicon (Si) semiconductor is decreased in the order from blue, green, red, to infrared light. That is, as for blue color, green color, red color, and infrared light included in incident light L1, by using the difference in position of light absorption in the depth direction of a semiconductor between wavelengths, layers for detecting visible light (blue, green, and red) and infrared light are provided in the Si semiconductor in the depth direction from the surface thereof as shown in FIG. 23B.

According to the structure described in Japanese Unexamined Patent Application Publication No. 2004-103964 in which the difference in position of light absorption in the depth direction of a semiconductor between wavelengths is exploited, the amount of light which can be detected is not decreased from a theoretical point of view; however, when passing through the layer in which blue color light is detected, red color light and green color light are absorbed to a certain extent and are then detected as blue color light. As a result, even in the case in which a blue signal is not present, when a green signal and a red signal enter the semiconductor, a signal also enters the layer in which blue color light is detected, and hence a pseudo signal is generated, so that sufficient color reproducibility may not be obtained.

In addition, as shown in FIG. 23A, most semiconductors have absorption sensitivity to infrared light. Hence, for example, in a solid-state imaging device (image sensor) using a Si semiconductor, in general, an infrared-cut filter made of a glass, one example of a subtractive filter, is necessarily provided before the sensor mentioned above. Accordingly, when image-taking is performed by receiving only infrared light or both visible light and infrared light as a signal, it is necessary that the infrared-cut filter be removed or that a ratio of cutting infrared light be reduced.

However, in the case described above, since visible light is incident on a photoelectric transducer together with infrared light, the hue of an image of the visible light becomes different from that of the original object. Hence, an image only made of the visible light and an image only made of the infrared light (or a mixture of the infrared light and the visible light) are not easily simultaneously separated from each other, and as a result, it is difficult to obtain respective appropriate images.

Besides the above problem, when an infrared-cut filter is used as is the case of a common solid-state imaging device, the sensitivity is degraded since visible light is also cut to a certain extent. In addition, by using an infrared-cut filter, the cost is inevitably increased.

In addition, according to the structures described in Japanese Unexamined Patent Application Publication Nos. 10-210486, 2002-369049, and 06-121325, a relatively large and complicated incident optical system is used for the wavelength separation optical system such as a wavelength separation mirror or prism; however, in the structures described in Japanese Unexamined Patent Application Publication Nos. 10-210486 and 06-121325, the separation properties have a limitation. Hence, infrared light which is separated unfavorably contains a small amount of a visible light component, and visible light which is separated also unfavorably contains a small amount of an infrared light component, so that both residual components generate pseudo signals. As a result, sufficient color reproducibility of the visible image may not be obtained, and the infrared image contains an unnecessary component of the visible image.

According to the structure described in Japanese Unexamined Patent Application Publication No. 2002-369049, visible light and infrared light are separated by the dichroic mirror, the infrared-cut filter is provided for the visible light passing through the dichroic mirror, and the visible light-cut filter is provided for the reflected infrared light, so that the wavelength separation is performed twice on the light path (incident optical system). Hence, the wavelength separation properties are improved as compared to that of the structure described in Japanese Unexamined Patent Application Publication Nos. 10-210486 and 06-121325; however, since the optical system becomes considerably large and complicated, and the cost is disadvantageously increased.

In addition, according to the structure described in Japanese Unexamined Patent Application Publication No. 09-166493, because of the insertion/extraction mechanism for an infrared-cut filter, the device becomes large and complicated, and the operation of the infrared-cut filter may not be automatically performed.

According to the structure described in Japanese Unexamined Patent Application Publication No. 09-130678, because of the diaphragm optical system having a wavelength separation mechanism, the device becomes inevitably large and complicated. In addition, although the infrared image (infrared light image) and the visible image (visible light image) can be simultaneously obtained, the image sensor can only output an electrical signal which is obtained by synthesizing the visible image and the infrared image and may not output only the visible image nor only the infrared mage.

On the other hand, according to the structure described in Japanese Unexamined Patent Application Publication No. 2002-142228, since the four types of color filters are disposed for wavelength separation, an incident optical system does not disadvantageously become large and complicated unlike the structures described in Japanese Unexamined Patent Application Publication Nos. 10-210486, 2002-369049, 06-121325, 09-166493, and 09-130678; however, the calculation processing is a problem. That is, according to the structure described in Japanese Unexamined Patent Application Publication No. 2002-142228, since the visible color image and the infrared image are independently obtained by performing matrix calculation of outputs of the pixels provided with the respective four types of color filters each having its own filter characteristic, the visible color image and the infrared image can be independently and simultaneously output; however, the separation properties have a limitation. Hence, as the structures described in Japanese Unexamined Patent Application Publication Nos. 10-210486, 2002-369049, and 06-121325, the visible image obtained by the separation may not have sufficient color reproducibility, and the infrared image unfavorably contains an unnecessary component of the visible image.

The present invention was made in consideration of the problems described above, and it is desirable to provide a new structure in which at least one of the above problems is solved. In particular, without considerably increasing the size of a wavelength separation optical system, it is desirable to have the structure in which the color reproducibility of a visible image can be further improved and to have the structure in which a visible image component present in an infrared image can be further suppressed.

As one example, there is provided an imager which has a new structure in which a visible color image having superior color reproducibility and a near-infrared image which substantially contains no visible light component can be independently obtained. In addition, as another example, the structure is provided in which when image-taking of a visible image and image-taking of an infrared image are simultaneously performed, a problem is solved in that the hue of the visible image becomes different from that of the original object, which is caused when an infrared-cut filter is removed. Accordingly, in the structure described above, an image (invisible image) of invisible light, such as infrared light or ultraviolet light, and a visible image having superior color reproducibility, that is, an accurate hue, can be simultaneously obtained. Furthermore, as still another example, the structure is also provided in which the increase in cost, which is caused by the use of an infrared-cut filter made of a glass having a large thickness as the case of a common imaging sensor, is suppressed.

An imager of an embodiment according to the present invention has a separation portion which separates an electromagnetic wave carrying an image into wavelength components; and image-taking portions detecting images of the wavelength components thus separated by the separation portion. In the imager described above, at least one of the image-taking portions has a detecting part optimized to detect a wavelength component which is to be detected.

In this imager, "to have a detecting part optimized to detect a wavelength component which is to be detected" means, in short, that wavelength separation is also performed in the image-taking portion.

That is, in the imager of an embodiment according to the present invention, the wavelength separation is first performed in an incident system which is provided before the image-taking portions, and the wavelength separation is then also performed in at least one of the image-taking portions, so that the wavelength separation is performed a plurality of times.

Some embodiments described below of the present invention particularly specify more advantageous examples of the imager described above.

For example, as the separation portion which performs the wavelength separation in the incident system provided before the image-taking portions, a separation portion having superior separation properties is used. As one example, a spectral filter is preferably used which is made of a predetermined substrate having an optical transparency to an electromagnetic wave and a laminate member provided thereon. In the laminate member mentioned above, layers having predetermined thicknesses are laminated to each other, and adjacent layers have different refractive indexes. In addition, the laminate member is formed to reflect one wavelength of the electromagnetic wave and transmit another wavelength thereof.

In addition, a laminate member is provided on an incident surface side of the detecting part on which an electromagnetic wave is incident. The laminate member described above has the structure in which layers having predetermined thicknesses are laminated to each other and adjacent layers have different refractive indexes so as to reflect a predetermined wavelength region component of the electromagnetic wave and so as to transmit the rest thereof.

Alternatively, wavelength separation may be performed using a monolayer film having a predetermined thickness. Even in the case in which a monolayer film is used, when the thickness thereof is changed, properties can be obtained which reflect a predetermined wavelength region component of an electromagnetic wave and transmit the rest thereof. Hence, a wavelength separation member using this monolayer film may be provided at the incident surface side of the detecting part on which an electromagnetic wave is incident.

Incidentally, "the rest" does not mean all wavelength components other than a reflection wavelength region component which is to be reflected but may be at least a component that does not practically contain the reflection wavelength region component. In addition, "that does not practically contain the reflection wavelength region component" means that influence of the reflection wavelength region component is not substantially present or may be slightly present in some cases. The reason for this is that when a signal capable of ignoring the influence of the reflection wavelength region component is obtained at a transmission wavelength region side, any problems may not occur. In addition, as is the case described above, when a signal capable of ignoring the influence of the transmission wavelength region component is obtained at the reflection wavelength region side, any problems may not occur.

In addition, for the structure in which wavelength separation is performed in each image-taking portion, for example, a spectral detecting part may be used having the structure in which a spectral filter using the above laminate member or monolayer film is integrally formed on the front surface of a light-receiving part.

Alternatively, the structure may be used in which wavelength separation is performed using the difference in position of light absorption between wavelengths in the depth direction of a semiconductor forming a detecting part, and in which while influence of a wavelength component other than a wavelength component which is to be detected by the detecting part is suppressed, the wavelength component which is to be detected by the above detecting part can be detected.

In the case described above, since the wavelength component other than that to be detected can also be detected, by using this detection result, the wavelength component to be detected by this detecting part and a wavelength component which is to be detected by another detecting part may be corrected.

According to an embodiment of the present invention, the structure is formed in which wavelength separation is surely performed in the incident system provided before the image-taking portions and is also performed in at least one of the image-taking portions.

Since the wavelength separation is performed in both the incident system and the image-taking system, the wavelength separation properties can be improved. For example, a visible image which is not influenced by infrared light and which has an accurate hue and an infrared image which is not influenced by visible light can be simultaneously obtained.

In addition, compared to the case in which wavelength separation is performed a plurality of times only in the incident system, the cost can be decreased, and the size of the device can also be decreased.

Furthermore, an imaging device of an embodiment according to the present invention includes a spectroscopic portion which separates incident light into transmitted light and reflected light depending on frequency of the incident light, and an imaging area receiving the transmitted light. In the above imaging device, the spectroscopic portion includes a multilayer structure having refraction index distribution.

BRIEF DESCRIPTION OF THE DRAWINGS

FIG. 8 is a graph showing reflection spectra illustrating the condition of a reflection central wavelength $\lambda$;

FIG. 19 is a schematic view illustrating the structure of a spectral image sensor for single-wavelength separation using a laminate film according to a fifth embodiment;

FIGS. 21A, 21B and 21C are schematic views showing the structure of an imager of the third embodiment according to the present invention;

DESCRIPTION OF THE PREFERRED EMBODIMENTS

Hereinafter, with reference to accompanying drawings, the embodiments of the present invention will be described in detail.

First Embodiment

Figure 1:
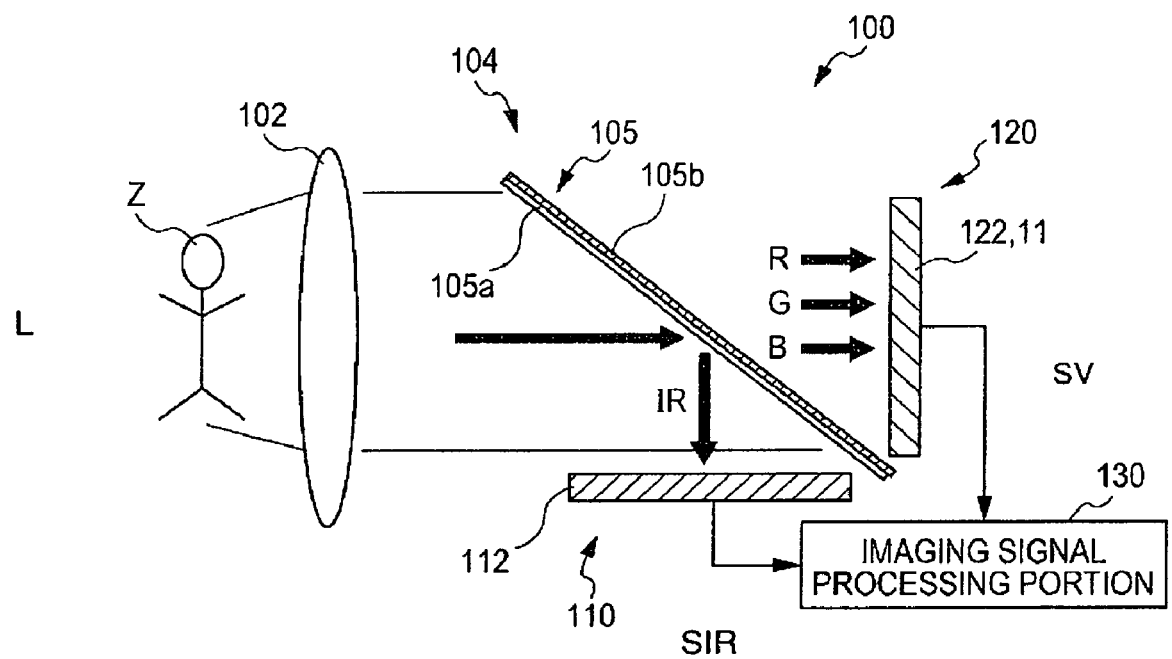
FIG. 1 is a schematic view showing the structure of an imager of a first embodiment according to the present invention.

FIG. 1 is a schematic view showing the structure of an imager of the first embodiment according to the present invention. An imager 100 of this first embodiment is an imager capable of independently obtaining a visible color image and a near-infrared image.

In particular, the imager 100 of the first embodiment has a taking lens 102 which guides light L carrying an image of an object Z to an image-taking portion side to form an image, and an optical member (hereinafter referred to as "wavelength separation optical system") 104 for wavelength separation which separates incident light L1 passing through the taking lens 102 into visible light VL and infrared light IR which is one example of invisible light.

In the above structure, the wavelength separation optical system 104 is one example of a wavelength separation portion which separates light passing through the taking lens 102 into a plurality of wavelengths, the light being one example of an electromagnetic wave carrying an image. That is, the imager 100 has the structure in which wavelength separation is performed in an incident system.

In addition, the imager 100 of the first embodiment also has an infrared image-taking portion 110 having an image sensor 112, a visible image-taking portion 120 having an image sensor 122, and an imaging signal processing portion 130, the image sensor 112 receiving the infrared light IR obtained by separation using the wavelength separation optical system 104 and forming an infrared image, the image sensor 122 receiving the visible light VL obtained by separation using the wavelength separation optical system 104 and forming a visible image, the imaging signal processing portion 130 processing imaging signals SIR and SV output from the infrared image-taking portion 110 and the visible image-taking portion 120, respectively.

In the structure described above, the imager 100 incorporates an optical image which represents the object Z and which contains the infrared light IR by using the taking lens 102 and separates the optical image into an infrared image (infrared light image) and a visible image (visible light image). In addition, after the infrared image and the visible image are converted to respective picture signals by the imaging signal processing portion 130, predetermined signal processing (such as color signal separation into R, G, and B components) is performed, so that a color image signal and an infrared image signal are output, or a mixed image signal formed of the aforementioned two signals is output.

For example, the taking lens 102 is a lens which is formed of an optical material such as quartz or sapphire transmitting light having a wavelength of approximately 380 to 2,200 nm and which incorporates an optical image containing the infrared light IR, so that the optical image is made incident on the wavelength separation optical system 104 while light of the optical image is being collected.

In the imager 100 of the first embodiment, the wavelength separation optical system 104 is provided on the optical axis of the taking lens 102 so that the incident light is separated into the visible light VL and the infrared light IR as invisible light, and while the infrared light IR is made incident on the infrared image-taking portion 110 after being totally reflected, the visible light is made incident on the visible image-taking portion 120 after passing through the wavelength separation optical system 104. The structure described above is a first feature of the imager 100 according to the first embodiment.

In particular, a mirror 105 is mounted, for example, at an angle of 45° relative to the optical axis, the mirror 105 totally reflecting the infrared light IR at a long wavelength side and transmitting all wavelength region components of the visible light VL having a wavelength shorter than that of the infrared light IR.

As for the mirror 105, in order to obtain superior wavelength separation properties, a mirror composed of an optical transparent substrate 105a and an optical filter 105b provided on a surface thereof is used. The optical filter 105b is a multilayered thin film (optical interference film) formed by depositing dielectric materials, and the substrate 105a is formed of an optical material such as quartz, sapphire, or a high molecular weight material.

Although the details will be described later, in this embodiment, the optical image emitted from the taking lens 102 thus obtained is incorporated and is then separated using the optical interference and reflection by the optical filter 105b into two wavelength regions as shown in the figure, that is, into the visible light VL having a wavelength of approximately 380 to 700 nm and the infrared light IR having a wavelength of approximately 700 to 2,200 nm, so that an infrared image thus obtained is made incident on the infrared image-taking portion 110 and so that a visible image is also made incident on the visible image-taking portion 120. Since the infrared light IR is totally reflected by the mirror 105, the diaphragm for absorbing the infrared light IR, which is necessary in the technique described in Japanese Unexamined Patent Application Publication No. 2002-369049, becomes unnecessary.

In addition, a second feature of the imager 100 according to the first embodiment is that a detecting part (image sensor) optimized to detect a wavelength component which is to be detected is provided for at least one of the image-taking portions 110 and 120. In particular, in the first embodiment, in the visible image-taking portion 120 which detects the visible light VL and a shorter wavelength side of the infrared light IR, the image sensor 122 optimized to detect the visible light VL is provided.

In this embodiment, the "optimized image sensor" indicates an image sensor having a wavelength separation structure in which the amount of a wavelength component other than a wavelength component which is to be detected is decreased as small as possible in an imaging signal of the wavelength component which is to be detected.

Since the image sensor has the wavelength separation structure as described above, the wavelength separation is performed twice, that is, the wavelength separation is performed on the light path by the wavelength separation optical system 104 and by the image sensor; hence, the size of the optical system can be decreased, and the wavelength separation properties can also be advantageously improved.

Although the details will be described later, a spectral image sensor (spectral detecting part) 11 is provided at the incident surface side of the image sensor 122 on which an electromagnetic wave is incident, the spectral image sensor 11 having the structure which performs wavelength separation using a dielectric laminate film. The dielectric laminate film is made of a laminate member in which layers having predetermined thicknesses are laminated to each other and in which adjacent layers have different refractive indexes from each other, the laminate member having properties which reflect a wavelength component (infrared light IR component in this embodiment) of the incident light (electromagnetic wave) other than that to be detected and which transmit the rest (visible light VL component in this embodiment) of the incident light. As the basic structure of the sensor, a CCD type, a CMOS type, and any other type structure may be used.

In other words, the features of the laminate member described above may be said that the wavelength component which is to be detected (visible light VL in this embodiment) of the incident light (electromagnetic wave) is transmitted and that the rest thereof (infrared light IR in this embodiment) is reflected.

In the first embodiment, in order to response the case in which the infrared light IR component leaks to the visible light VL detection side, the image sensor 122 is used in the visible image-taking portion 120, the sensor 122 having a spectral image sensor structure using a dielectric laminate film which is optimized to detect the visible light VL. Accordingly, without substantially receiving the influence of the infrared light IR, the visible image can be obtained independently of the infrared image.

For example, by using the wavelength separation optical system 104, when the infrared light IR is reflected to the infrared image-taking portion 110 side and when the visible light VL is transmitted to the visible image-taking portion 120 side, a component at the visible light side depends on the separation capability of the wavelength separation optical system 104, and although the visible light VL is a primary component, several percent of the infrared light IR is still inevitably contained therein.

Hence, when the image sensor 122 is used having a spectral image sensor structure using a dielectric laminate film, the leak of the infrared light IR can be optically excluded, and only photoelectrons of the incident visible light VL component are converted into electrical signals.

Incidentally, according to the structure described in Japanese Patent Application No. 2004-358139, proposed by the inventors of the present invention, wavelength separation is not performed on a light path, spectral filters using a dielectric multilayer film are integrally formed on visible light detecting pixels (particularly, each of R, G, and B pixels) on one image sensor, and spectral filters using a dielectric multilayer film are not formed on infrared light detecting pixels, so that the visible image and the infrared image can be independently and simultaneously obtained.

In the case described above, since a considerable leak caused by oblique incident light is present, one component is influenced by the leak of the other component and vice versa; hence, the color reproducibility of the visible image obtained by wavelength separation may be decreased by an amount corresponding to the amount of leak, and the leak of the visible image may unfavorably appear in the infrared image in some cases.

On the other hand, in this first embodiment, since the structure is formed in which the visible light VL and the infrared light IR are detected by the independent image sensors 122 and 112, respectively, it is not necessary to consider the influence of the leak caused by oblique incident light.

The structure of this first embodiment is different from the structure described in Japanese Unexamined Patent Application Publication Nos. 10-210486 and 06-121325 in which the wavelength components separated by the wavelength separation optical system are made incident on the respective sensors having the structures equivalent to each other so that the visible image and the infrared image are independently obtained. According to the first embodiment, the structure is formed in which even in the image-taking system, the wavelength separation is performed, followed by the detection, the entire wavelength separation properties can be improved.

In addition, the structure of the first embodiment is different from that described in Japanese Unexamined Patent Application Publication No. 10-210486 in which the visible light component passing through the cold mirror is further separated into a red color, a green color, and a blue color component by the three dichroic mirrors and in which the components thus obtained are made incident on the respective sensors so as to obtain respective R, G, and B images of the visible light VL. According to the method described above, the three sensors are necessary for the visible light VL, and although the sensitivity is improved, the cost is disadvantageously increased. However, in the structure of the first embodiment, the problem described above may not occur at all.

In addition, the structure of the first embodiment is also different from that described in Japanese Unexamined Patent Application Publication No. 2002-369049 in which wavelength separation is performed twice on the light path, and in which components thus separated are made incident on the respective sensors having structures similar to each other so as to independently obtain the visible image and the infrared image. According to the method described in Japanese Unexamined Patent Application Publication No. 2002-369049, since the wavelength separation is performed twice on the light path, the optical system becomes disadvantageously large and complicated. In addition, problems of sensitivity, blurring and the like may occur. However, according to the structure of the first embodiment, the problems described above will not occur at all.

For example, according to the structure of the first embodiment, in image-taking of the visible light VL performed in the visible image-taking portion 120, it is not necessary to insert an infrared-cut filter, which is one example of a subtractive filter, before the image sensor 122. Since an expensive infrared-cut filter is not necessary, the cost can be significantly decreased. In addition, since an infrared-cut filter having a certain thickness and a certain weight is not used, the optical system can be decreased in size and in weight. Of course, since an insertion and extraction mechanism for an infrared-cut filter is not necessary, the device is not large and complicated. Compared to the case in which an existing infrared-cut filter made of a glass is used, the cost can be advantageously decreased, and in addition, owing to a smaller size, an imager such as a digital camera having superior portability can be provided.

In addition, in the structure in which an infrared-cut filter is provided before the image sensor 122, since a glass substrate is provided before an imaging device such as a CCD or a CMOS, the interface between the air and the glass is formed on the light path. Hence, even the visible light VL which preferably passes is also reflected on the interface, and as a result, the sensitivity is disadvantageously degraded. In addition, when the number of interfaces as described above is increased, the refracting angle (in the glass) in oblique incidence varies between wavelengths, and as a result, the focus is blurred due to the change in light path. On the other hand, when an infrared-cut filter is not provided between the wavelength separation optical system 104 and the image sensor 122, the focus blurring as described above can be advantageously avoided.

In order to further improve the wavelength separation properties, although the optical system is disadvantageously increased in size, when a small amount of the infrared light IR leaks and is incident on the visible image-taking portion 120, an infrared-cut filter which is weak as a whole may be provided between the wavelength separation optical system 104 (mirror 105) and the visible image-taking portion 120 (at the light-receiving side of the visible image-taking portion 120). For example, when an infrared-cut filter of 50% or less is provided, the infrared light IR can be cut to a level at which the visible light VL is not substantially influenced.

In addition, when a small amount of the visible light VL leaks and is incident on the infrared image-taking portion 110, a visible light-cut filter which is weak as a whole may be provided between the wavelength separation optical system 104 (mirror 105) and the infrared image-taking portion 110 (at the light-receiving side of the infrared image-taking portion 110). For example, when a visible light-cut filter of 50% or less is provided, the visible light VL can be cut to a level at which the infrared light IR is not substantially influenced.

For example, in application in which image-taking of an image of the infrared light IR which is not substantially influenced by the visible light VL is simultaneously performed, such as optical communication application and application in which the position is detected by tracing an infrared emission point, a color filter may be provided at the light-receiving side of the image sensor 112, the color filter transmitting at least the infrared light IR, which is the reflection wavelength region component, and also transmitting a predetermined wavelength component of the visible light VL which is the transmission wavelength region component.

For example, when the visible light-cut filter is not provided at the light-receiving side of the image sensor 112, the visible light VL component leaks to the side detecting the infrared light IR, and the infrared image mixed with a visible image of this leak component is obtained. In order to exclude the mixed visible image and in order to obtain an infrared image which is not substantially influenced by the visible light VL, for example, the intensities of blue, red, and green colors detected by three color pixels R, G, and B, which are obtained by the image sensor 122, must be decreased.

On the other hand, for example, when a green color filter which transmits the infrared light IR and green color light is provided as a visible light-cut filter, a component containing both the infrared light IR and green visible light LG is obtained from the image sensor 112; however, by the difference from a green color component only made of the visible light VL which is obtained from the image sensor 122, an image of the infrared light IR which is not substantially influenced by the visible light VL (green color light G in this case) can be obtained. Although the green color filter is necessarily provided at the light-receiving side of the image sensor 112, compared to the case in which the intensities of blue, red, and green colors detected by the three pixels R, G, and B are decreased without providing the green color filter, the process becomes easy.

In addition, when a black color filter, which transmits the infrared light IR and which absorbs only the visible light VL, is provided as a visible light-cut filter so as to absorb the visible light VL, a component only made of the infrared light IR is obtained from the image sensor 112, and without performing the difference processing, an infrared image made of the infrared light IR which is not substantially influenced by the visible light VL can be obtained.

<Relationship Between Image-Taking and Wavelength Separation Using Dielectric Laminate Film>

On image-taking surfaces of the image sensors 112 and 122, charges corresponding to the infrared light IR and charges corresponding to the visible light VL are generated, both light carrying an image of the object Z. Operation such as operation of accumulating charges and operation of reading charges are controlled by a sensor-driving pulse signal output from a system control circuit (not shown) to a driving circuit (not shown).

Charge signals read from the image sensors 112 and 122, that is, an infrared imaging signal SIR carrying an infrared image and a visible imaging signal SV carrying a visible image are sent to the imaging signal processing portion 130, are amplified to a predetermined level thereby, and are then converted from an analog signal to a digital signal. In addition, after the digital image signal is processed by gamma correction and then separated into color separation signals of R, G, and B, these signals are converted to brightness signals and color signals or converted to picture signals formed from the aforementioned two types of signals, followed by output thereof.

In this embodiment, when the mirror 105 using a dielectric laminate film is applied to the wavelength separation optical system 104 for cutting the infrared light IR and transmitting the visible light VL so as to receive the infrared light IR and the visible light VL by respective image sensors, that is, when the infrared light is cut or is not cut depending on the situation, image-taking only using the visible light VL and image-taking only using the infrared light IR can be simultaneously performed, or image-taking only using the visible light VL and image-taking using both the infrared light IR and the visible light VL can be simultaneously performed.

Image-taking of a monochrome image or a color image in the daytime can be performed without receiving any influence of the infrared light IR, and in the night, image-taking can be performed using the infrared light IR. Whenever necessary, the visible image and the infrared image can be simultaneously output. Even in this case, in the daytime, an image only made of the infrared light IR can be obtained without receiving any influence of the visible light VL.

For example, a monochrome image made of the visible light VL can be obtained which is not substantially influenced by the infrared light IR. Unlike the structure described in Japanese Unexamined Patent Application Publication No. 2002-142228, when the monochrome image made of the visible light VL is obtained which is not substantially influenced by the infrared light IR, the calculation processing with the infrared light IR component is not necessary.

Furthermore, as an example of an optical member which separates the visible light VL into predetermined wavelength region components, when color filters having predetermined wavelength transmission properties in the visible light VL region are provided on the image sensor 122 so as to correspond to pixels (unit pixel matrix), an image made of a specific wavelength region in the visible light VL region can be obtained which is not substantially influenced by the infrared light IR.

In addition, when color filters having different wavelength transmission properties in the visible light VL region are integrally arranged in a regular manner on photodiodes forming a unit pixel matrix so as to be aligned with the photodiodes for respective wavelengths (for respective colors), the visible light VL can be separated into wavelengths (into colors), and when synthesis processing is performed based on pixel signals obtained from these pixels having respective colors, a color image (visible color image) made of the visible light VL which is not substantially influenced by the infrared light IR can be obtained. Unlike the structure described in Japanese Unexamined Patent Application Publication No. 2002-142228, when the color image of the visible light VL which is not substantially influenced by the infrared light IR is obtained, the calculation processing with the infrared light IR component is not necessary.

In addition, when the image sensor 112 for infrared light IR and the image sensor 122 for the visible light VL are used, a monochrome image or a color image of the visible light VL and an "image relating to the infrared light IR" may always be independently obtained. The "image relating to the infrared light IR" means an image of the infrared light IR which is not substantially influenced by the visible light VL, or an image made of a mixture of the infrared light IR and the visible light VL.

Image-taking (monochrome image-taking or color image-taking) of an image of the visible light VL which is not substantially influenced by the infrared light IR and image-taking of an image containing both the infrared light IR and the visible light VL can also be simultaneously performed. In addition, by synthesis processing (in particular, difference processing) of a component (monochrome image component or color image component) only made of the visible light VL and a component containing both the visible light VL and the infrared light IR, image-taking of an image of the infrared light IR which is not substantially influenced by the visible light VL can also be performed.

Incidentally, in consideration that an image is finally recognized by human visual sensation, the above "which is not substantially influenced" may also mean "which may be slightly influenced" as long as a clear difference may not be generally recognized by human visual sensation. That is, it may be acceptable when an infrared image (one example of physical information) which can ignore the influence of a transmission wavelength region (visible light VL) is obtained at the infrared light IR side and when a general image (one example of physical information) which can ignore the influence of a reflection wavelength region component (infrared light IR) is obtained at the visible light VL side.

In addition, as the color filters, there may be used primary color filters such as three primary color filters of the visible light VL (wavelength λ in the range of 380 to 780 nm). In the visible light VL, there are a blue color component (for example, the transmittance is approximately 1 at a wavelength λ of 400 to 500 nm and is approximately zero at a wavelength other than that), a green color component (for example, the transmittance is approximately 1 at a wavelength λ of 500 to 600 nm and is approximately zero at a wavelength other than that), and a red color component (for example, the transmittance is approximately 1 at a wavelength λ of 600 to 700 nm and is approximately zero at a wavelength other than that).

Alternatively, there may be used complementary color filters contains components having approximately zero transmittance with respect to the visible three primary color components, such as yellow (Ye) (for example, the transmittance is approximately zero at a wavelength λ of 400 to 500 nm and is approximately 1 at a wavelength other than that), magenta (Mg) (for example, the transmittance is approximately zero at a wavelength λ of 500 to 600 nm and is approximately 1 at a wavelength other than that), and cyan (Cy) (for example, the transmittance is approximately zero at a wavelength λ of 600 to 700 nm and is approximately 1 at a wavelength other than that).

Since having a higher sensitivity than that of the primary color filters, when the complementary color filters having colors complementary to the respective primary colors are used for transmitted light in the visible light region, the sensitivity of an imager can be improved. On the other hand, when the primary color filters is used, easy signal processing can be advantageously performed since primary color signals can be obtained without performing difference processing.

In addition, "a transmittance of approximately 1" indicates an ideal state and may include the case in which the transmittance in a specific wavelength region is significantly larger than that in the other wavelength regions. Hence, a filter may have a transmittance of other than 1 in a part of the specific wavelength region. In addition, "a transmittance of approximately zero" indicates an ideal state as described above and may include the case in which the transmittance in a specific wavelength region is significantly smaller than that in the other wavelength regions. Hence, a filter may have a transmittance of other than zero in a part of the specific wavelength region.

In addition, any primary color filter and any complementary color filter may be used as long as transmitting a wavelength region component of a predetermined color (primary color or complementary color) in the visible light VL region, which is the transmission wavelength region component, regardless whether the infrared light IR region, which is the reflection wavelength region component, is transmitted or not, that is, regardless of the transmittance for the infrared light IR. The reason for this is that the infrared light IR component is cut by the mirror 105 using a dielectric laminate film.

For example, in the visible light band, general color filters which are currently used have high transmittances for the respective R, G, and B colors and low transmittances for the other colors (for example, in the case of R, the other colors are G and B). However, the transmittance for the band other than the visible light band is not particularly specified, and in general, the transmittance is generally higher than that for the other colors (for example, in the case of R, the other colors are G and B). For example, each filter has sensitivity to the infrared light region and transmits light in the infrared light region. However, in this embodiment, even when a filter having high transmittance properties is used, any problems may not occur.

<Concept of Wavelength Separation Using Dielectric Laminate Film>

Figure 2:
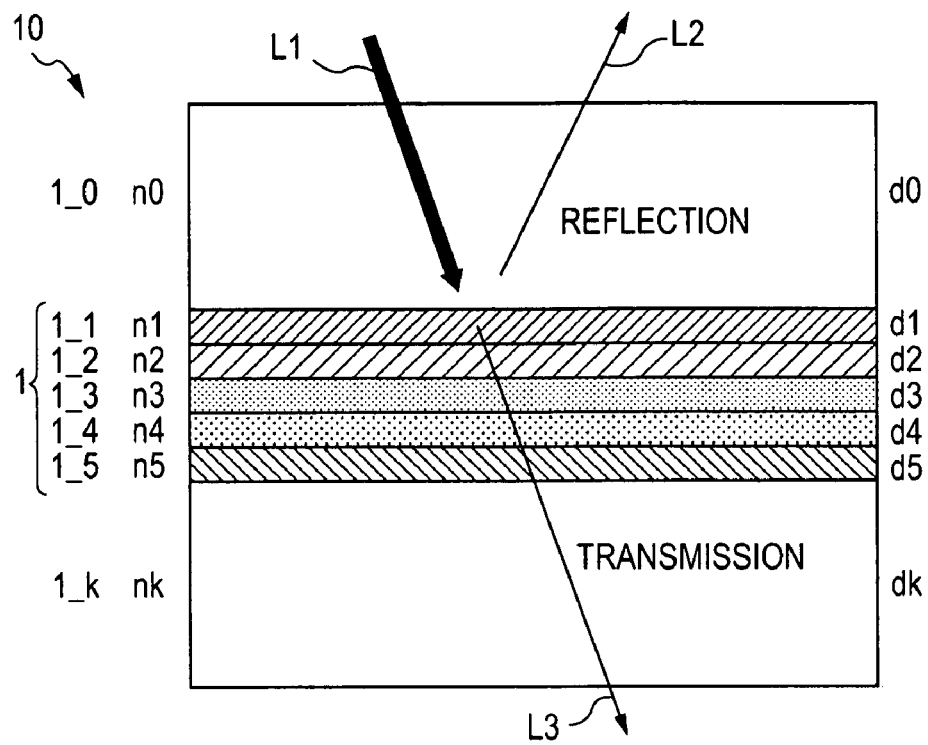
FIG. 2 is a schematic view illustrating a spectral filter which separates an electromagnetic wave into predetermined wavelengths using a dielectric laminate film.

FIG. 2 is a view illustrating the concept of the wavelength separation in which an electromagnetic wave is separated into predetermined wavelengths using a dielectric laminate film. In this embodiment, an example will be described in which light, which is an electromagnetic wave, is separated into predetermined wavelengths.

As shown in FIG. 2, a dielectric laminate film 1 is a laminate member composed of layers each having a predetermined thickness dj (j is an integer of 1 or more, and hereinafter, j indicates the same meaning as described above) and being laminated to each other, and in this laminate film 1, a refractive index nj of one layer is different from that of a layer adjacent thereto (difference in refractive index being represented by Δn). Accordingly, as described later, properties can be obtained which reflect a predetermined wavelength region component of the electromagnetic wave and transmit the rest thereof.

The way of counting the number of dielectric layers, a j-th layer being represented by a layer 1_j, forming the dielectric laminate film 1 is that thick layers (a 0-th layer 1_0 and a k-th layer 1_k) provided at the two sides are not counted as the number of layers, and for example, the number of layers is counted from a first layer toward the k-th layer side. Actually, the dielectric laminate film 1 is formed without the two thick layers (the 0-th layer 1_0 and the k-th layer 1_k).

When light is made incident on the dielectric laminate film 1 having the structure as described above, the reflectance (or transmittance) tends to have dependence on the wavelength k to a certain extent due to the interference in the dielectric laminate film 1. As the difference Δn in refractive index is increased, the above effect becomes significant.

In particular, in the case in which the dielectric laminate film 1 has a periodical structure or satisfies a certain condition (for example, a thickness d of each layer is approximately λ/4n), when incident light L1 such as white light is incident, the reflectance of light (specific wavelength region light) in a specific wavelength region is effectively increased so that most thereof is turned into a reflected light component L2, that is, the transmittance can be decreased, and in addition, the reflectance of the other light can be decreased so that most thereof is turned into a transmitted light component L3, that is, the transmittance can be increased.

In this case, the wavelength λ is a central wavelength in a certain wavelength region, and n indicates the refractive index of the layer. In this embodiment, by using the wavelength dependence of the reflectance (or transmittance) of this dielectric laminate film 1, a spectral filter 10 is realized.

<Basic Structure of Spectral Filter Using Dielectric Laminate Film>

Figure 3:
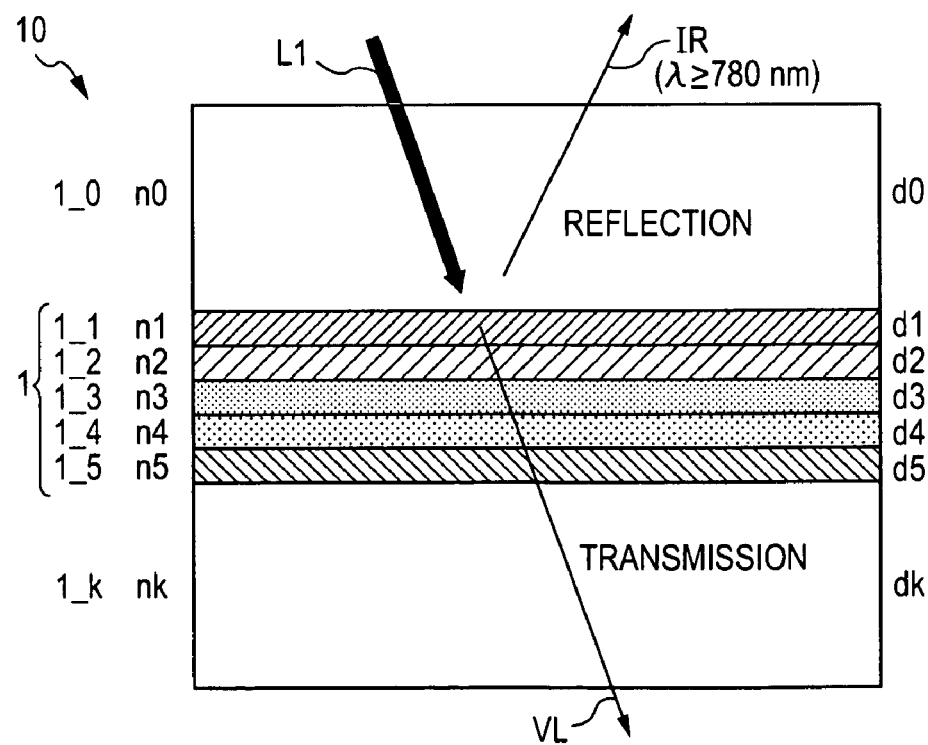
FIG. 3 is a schematic view illustrating a basic structure of a spectral filter using a dielectric laminate film.

FIG. 3 is a conceptual view of the basic structure of the spectral filter 10 suitably applied to the mirror 105 using a dielectric laminate film. FIG. 3 shows the case in which light is separated into infrared light IR and visible light VL. When the dielectric laminate film 1 is formed so as to have a high reflectance for the infrared light IR having a wavelength λ (primarily at a long wavelength side of 780 nm or more) in an infrared region which is a longer wavelength side than that of the visible light VL, the infrared light IR can be cut.

As members (layer materials) of the dielectric layers, a j-th layer being represented by a layer 1_j, forming the dielectric laminate film 1, since the dielectric laminate film 1 is formed of a plurality of layers, at least two types of members are used, and in addition, when the dielectric laminate film 1 is formed of at least three layers, all the layers may be formed of members different from each other, or two types (or more than that) of members may be laminated alternately or in an optional order. In addition, the dielectric laminate film 1 may be basically formed of a first and a second layer material, and a part of the dielectric laminate film 1 may be replaced with a third layer material (or with two new types of layer materials or more). Hereinafter, the structure will be described in detail.

<<Method for Designing Dielectric Laminate Film; Example of Infrared Light Cut>>

<Method for Designing Thickness dj>

Figure 4:
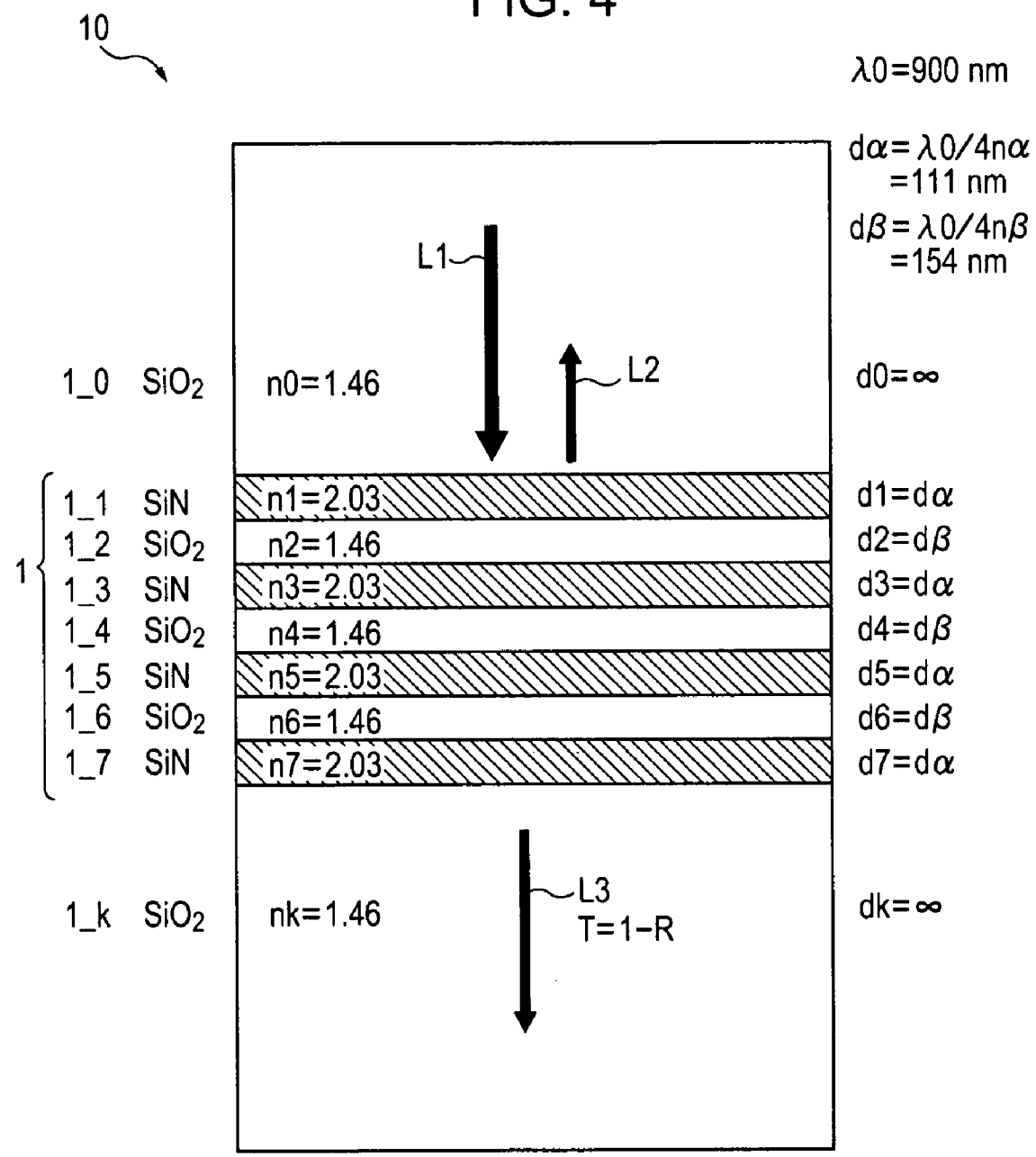
FIG. 4 is a schematic view illustrating a basic concept of a method for designing a laminate film.
Figure 5:
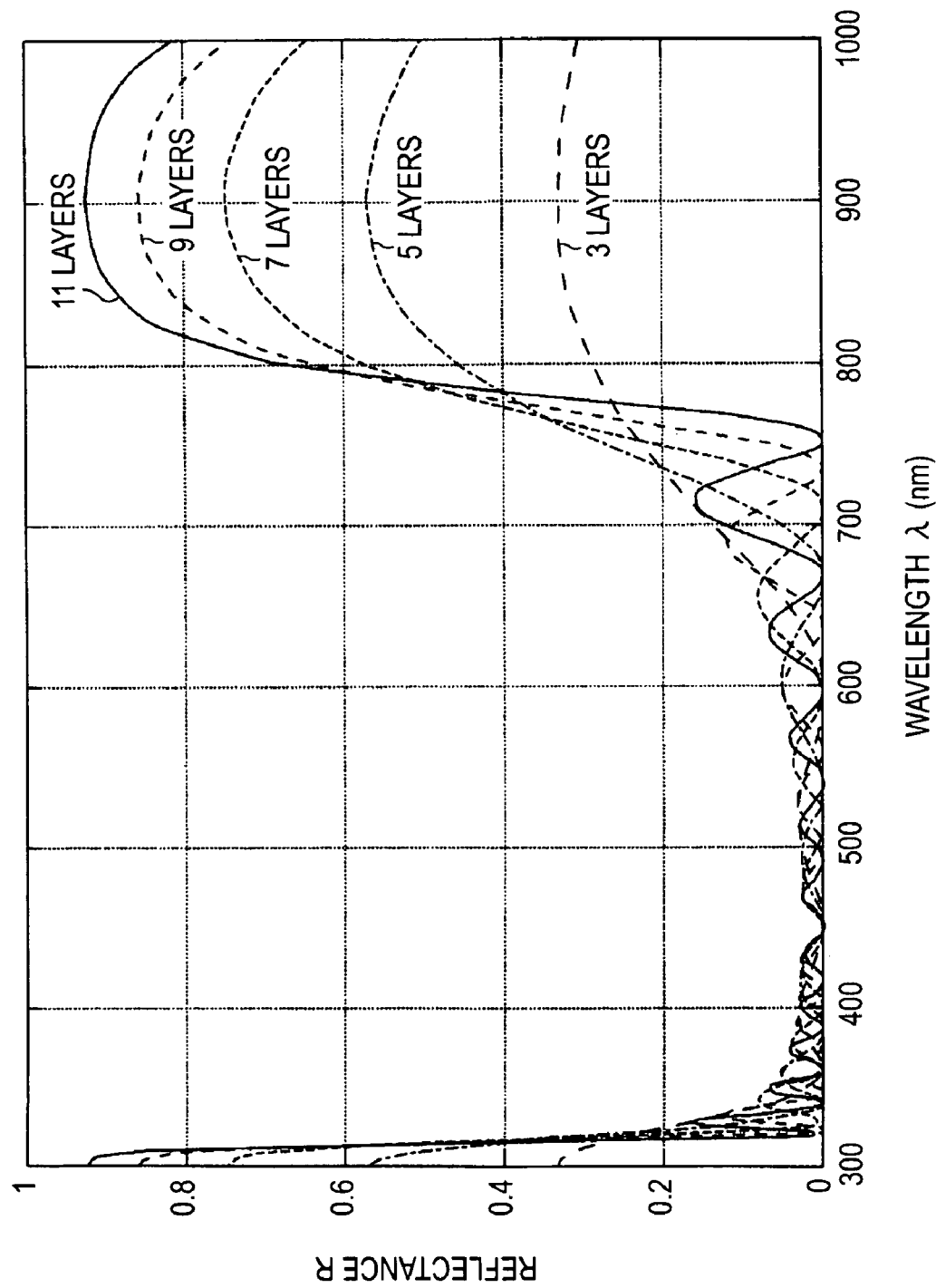
FIG. 5 is a graph showing reflection spectra illustrating a basic concept of a method for designing a laminate film.
Figure 6:
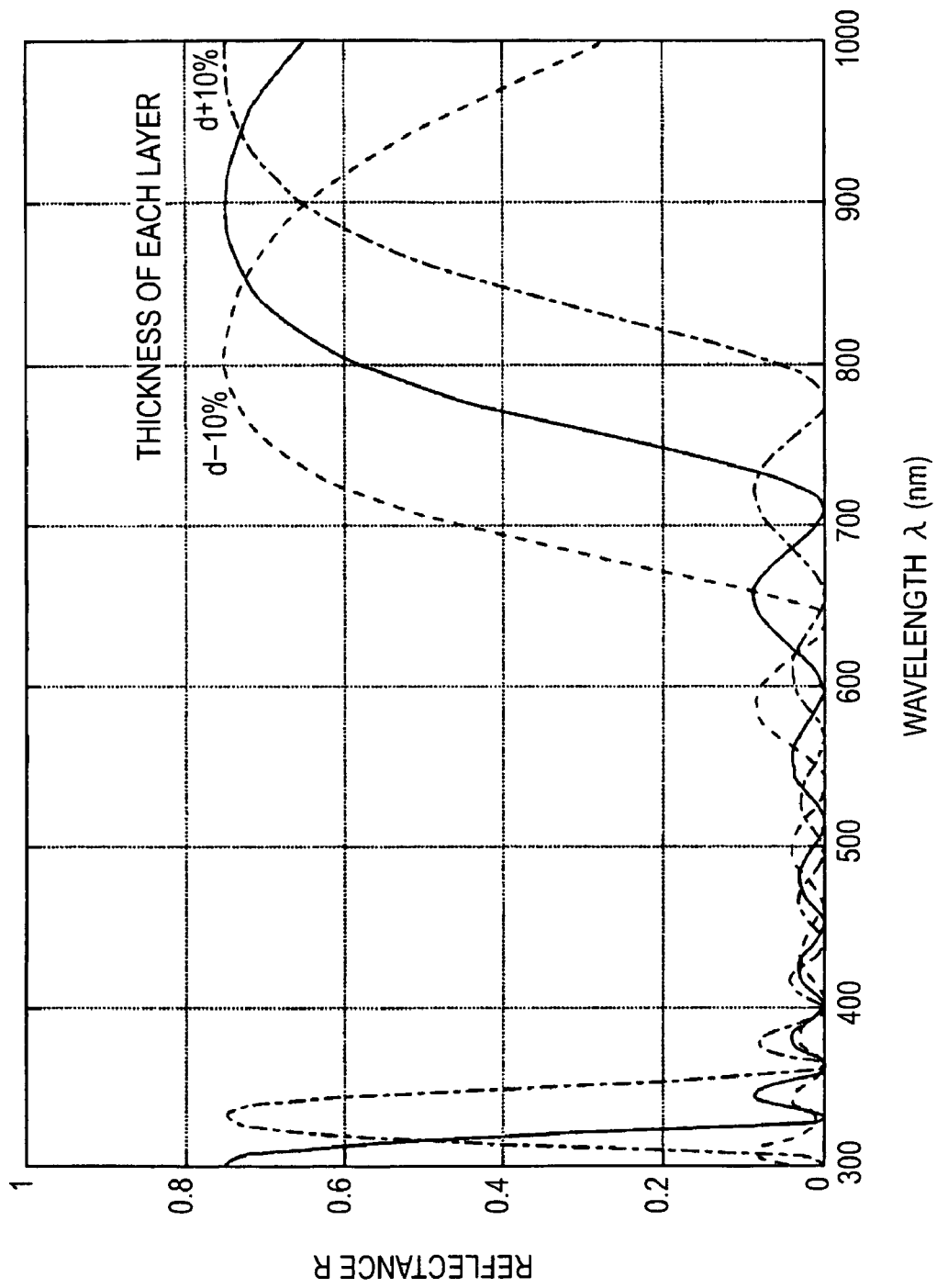
FIG. 6 is a graph showing reflection spectra illustrating a basic concept of a method for designing a laminate film.
Figure 7A:
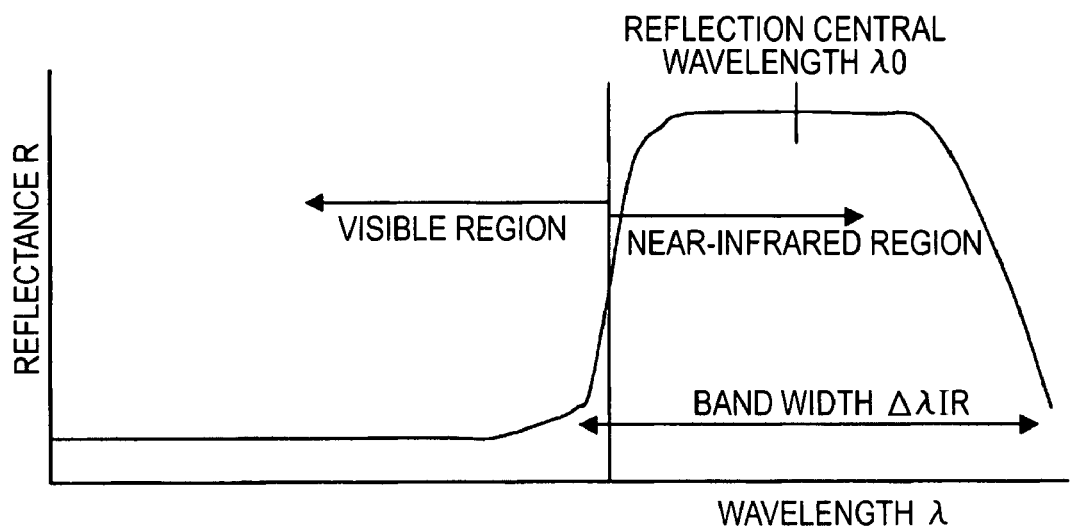
FIGS. 7A and 7B are views each illustrating the condition of a reflection central wavelength $\lambda$ (views each showing the concept of a reflection spectrum)
Figure 7B:
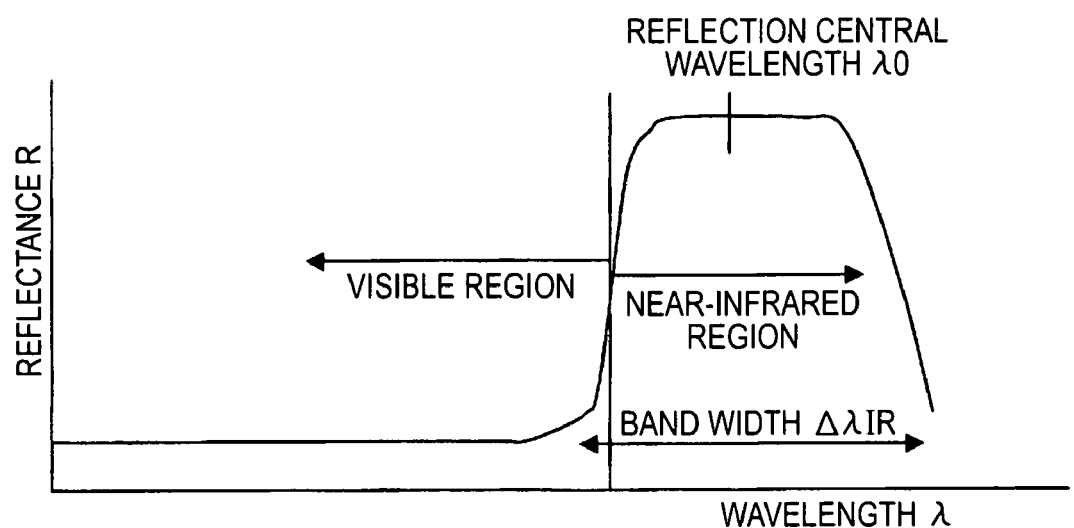

FIGS. 4 to 6 are views illustrating a basic concept of a method for designing the dielectric laminate film 1. In this embodiment, a design example will be described in which the dielectric laminate film 1 is formed of basic first and second layer materials so as to selectively reflect the infrared light IR.

As shown in a structural view of FIG. 4, the dielectric laminate film 1 used in this embodiment is sandwiched at the two sides thereof by thick layers made of silicon oxide (hereinafter referred to as "$SiO_2$"), the layer provided at the light incident side being called a 0-th layer and a layer opposite thereof being called a k-th layer, and a plurality of dielectric layers, a j-th layer being represented by a layer $1\_j$, made of the first and the second layer materials are laminated to each other so as to form the dielectric laminate film 1. In the example shown in the figure, as the first and the second layer materials forming the dielectric layers, a j-th layer being represented by a layer $1\_j$, common materials are used. That is, silicon nitride $Si_3N_4$ (hereinafter referred to as "SiN") is used as the first layer material, silicon oxide $SiO_2$ is used as the second layer material, and these two types of materials are laminated alternately. In addition, it is assumed that the structure of the dielectric laminate film 1 is provided with silicon oxide layers each having a sufficiently large thickness ($d0=dk=\infty$ holds) at the top and the bottom sides.

When the dielectric laminate film 1 thus formed satisfies the following conditional equation (1), the reflectance can be effectively increased.

$$dj=\lambda 0/4nj \quad (1)$$

In the above equation, dj (j indicates a layer number, and hereafter, j indicates the same meaning as described above) is the thickness of a dielectric layer $1\_j$ forming the dielectric laminate film 1; nj indicates the refractive index of the dielectric layer $1\_j$; and $\lambda 0$ is a central wavelength (hereinafter referred to as "reflection central wavelength) of the reflection wavelength region.

The way of counting the number of dielectric layers, a j-th layer being represented by a layer $1\_j$, forming the dielectric laminate film 1 is that thick $SiO_2$ layers provided at the two sides are not counted as the number of layers, and the number of layers is counted from the first layer toward the k-th layer side. For example, the structure of a SiN layer/a $SiO_2$ layer/a SiN layer is a three-layered structure, and a SiN layer/a $SiO_2$ layer/a SiN layer/a $SiO_2$ layer/a SiN layer is a five-layered structure. In FIG. 4, a seven-layered structure is shown.

In addition, the reflection central wavelength $\lambda 0$ of the infrared light IR of the reflection wavelength region is set to 900 nm, the silicon nitride SiN forming the odd-numbered layers has a refractive index $n\alpha$ of 2.3, the silicon oxide $SiO_2$ forming the 0-th layer, the k-th layer, and the even-numbered layers has a refractive index $n\beta$ of 1.46, and the difference $\Delta n$ in refractive index is 0.57.

In addition, in accordance with the above conditional equation (1), the thickness dj (=d1, d3, ... ; j indicates an odd number) of the silicon nitride SiN is set to 111 nm, and the thickness dj (=d2, d4, ... ; j indicates an even number) of the silicon oxide $SiO_2$ is set to 154 nm.

FIG. 5 is a graph showing the reflectances R (reflection spectra) calculated using the effective Fresnel coefficient method by changing the number of layers, which are formed of common materials, of the structure shown in FIG. 4, and by these results, the layer number dependence of the reflection spectra can be obtained.

From the results shown in FIG. 5, it is understood that as the number of layers is increased, the reflectance R having a peak around 900 nm, which is the reflection central wavelength $\lambda 0$ of the infrared light IR, is increased. Furthermore, it is understood that when a wavelength of 900 nm is selected as the reflection central wavelength $\lambda 0$, the infrared light IR and the visible light VL are approximately separated from each other. According to the results shown in FIG. 5, it is understood that when the number of layers is set to 5 or more, a reflectance R of 0.5 or more can be obtained, and in particular, it is also understood that when the number of layers is set to 7 or more, the reflectance R can be preferably increased to more than 0.7.

FIG. 6 is a graph illustrating the thickness dependence of the reflectance R (the change in reflectance caused by variation in thickness of the dielectric layer $1\_j$). In this graph, the results (reflection spectra) are shown obtained by calculation based on the case in which a seven-layered structure is formed, and in which the thickness of each dielectric layer is changed by ±10%.

The conditional equation (1) is an ideal value obtained by calculation based on the Fresnel coefficient method; however, in practice, the condition represented by the equation (1) is mild and has a wide range. For example, it is understood by calculation based on the Fresnel coefficient method that even when the thickness dj has an error of ±10%, the reflectance can be effectively increased.

As shown in FIG. 6, it is understood that even when the thickness dj varies, the reflectance R can be effectively increased. For example, at the reflection central wavelength $\lambda 0$ of 900 nm of the infrared light IR, a sufficient reflectance R, such as 0.5 or more, can be obtained, and in the entire infrared light IR (primarily at a long wavelength side of 780 nm or more), it is understood that strong reflection occurs. Hence, in consideration of the variation, when the thickness dj of the dielectric layer $1\_j$ is practically set within the range represented by the following equation (2), the reflectance can be effectively and significantly increased.

$$0.9\times\lambda 0/4n \leq dj \leq 1.1\times\lambda 0/4n \quad (2)$$

<Method for Designing Reflection Central Wavelength $\lambda 0$>

FIGS. 7A to 9 are views illustrating the condition of the reflection central wavelength $\lambda 0$. The numeric condition of the thickness dj depends on a spectral band width $\Delta\lambda IR$ of an infrared reflection region. As can be seen from FIG. 7A in which the concept of a reflection spectrum is shown, in the case in which the band width $\Delta\lambda IR$ of the infrared reflection region is large, when the central wavelength $\lambda 0$ is not set at a long wavelength side, the reflection of the visible light VL becomes significant. In addition, as can also be seen from FIG. 7B in which the concept of a reflection spectrum is shown, in the case in which the band width $\Delta\lambda IR$ of the infrared reflection region is small, when the central wavelength $\lambda 0$ is not set at a short wavelength side, the reflection in an infrared region close to the visible light VL may not occur. Hence, in consideration of the phenomena described above, superior wavelength separation properties for the visible light VL and the infrared light IR can be obtained.

Figure 23A:
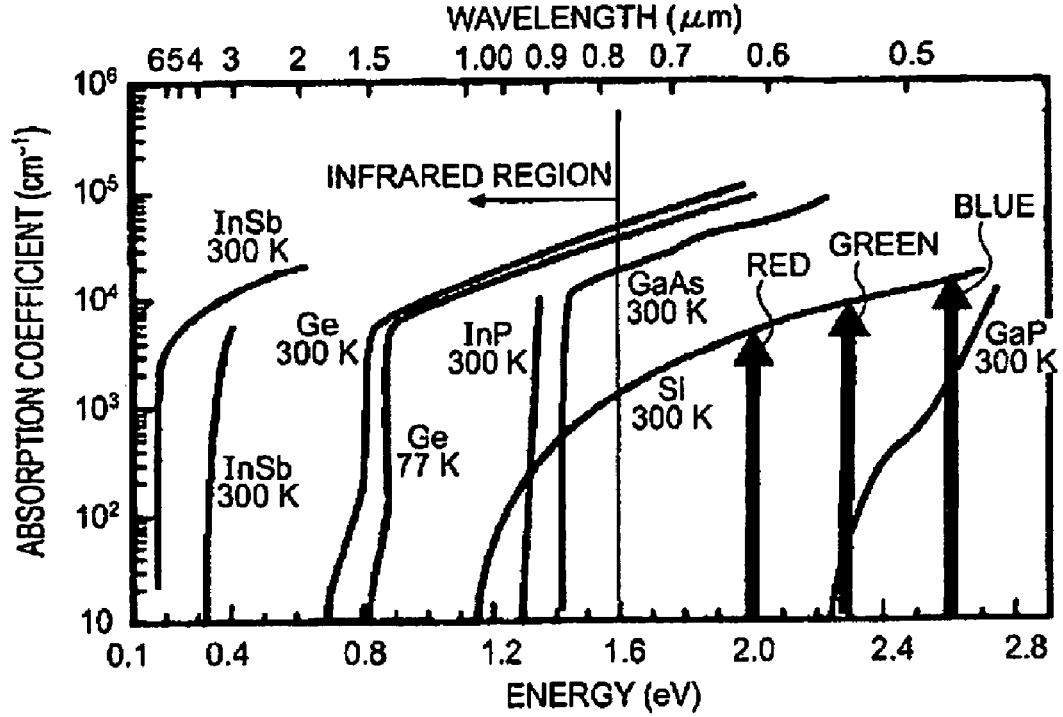
FIGS. 23A and 23B are views schematically illustrating the structure of a sensor described in Japanese Unexamined Patent Application Publication No. 2004-103964.
Figure 23B:
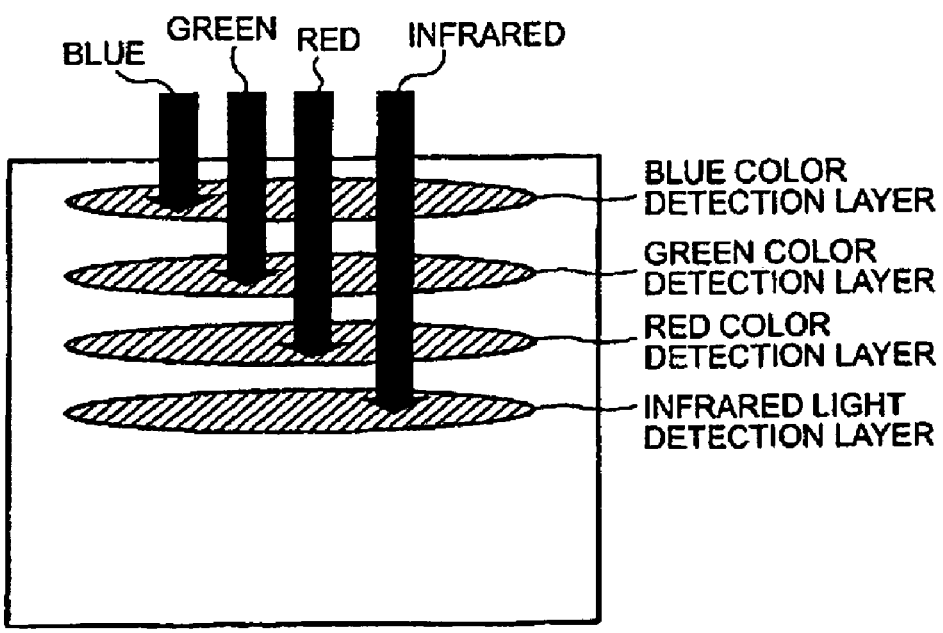

From the graph of adsorption spectra of silicon Si shown in FIG. 23, it is understood that when infrared light IR in the range of 0.78 μm to 0.95 μm in the infrared region is reflected, a sufficient infrared-cut effect can be obtained. The reason for this is that most of light at a long wavelength side of 0.95 μm or more is not absorbed in the silicon Si and is not photoelectrically converted. Hence, as a result, the reflection central wavelength $\lambda 0$ may be selected so as to reflect the infrared light IR in the range of 0.78 μm to 0.95 μm.

In addition, also in the visible light VL region, since light in the red R region having a wavelength of 640 to 780 nm has a low visibility, regardless whether the above light is reflected or not, it is believed that properties of an imaging device are not adversely influenced. Hence, even when reflection occurs in a wavelength region of 640 to 780 nm, any inconveniences may not occur at all.

Furthermore, the band width $\Delta\lambda IR$ of the infrared reflection region is increased when the difference $\Delta n$ in refractive index of the dielectric laminate film 1 is large, and to the contrary, when the difference $\Delta n$ in refractive index is small, the band width $\Delta\lambda IR$ is decreased. Hence, the band width $\Delta\lambda IR$ of the infrared reflection region is decreased when the multilayered film is made of SiN/SiO$_2$, and the band width ΔλIR is increased when the multilayered film is made of Si/SiO$_2$.

Accordingly, when the multilayered film is made of SiN/SiO$_2$ (difference Δn in refractive index being 0.57), from the calculation results based on the reflection central wavelengths λ0 of 780 nm and 950 nm shown in the reflection spectra in FIG. 8, it is understood that the above conditions are almost satisfied when the reflection central wavelength λ0 is set in the range of 780 to 950 nm. Incidentally, the results shown in FIG. 8 are obtained from a laminate structure shown in FIG. 13 which will be described later and are also obtained by calculation by only changing the film thickness dj of the dielectric layer 1_j so as to obtain a central wavelength λ0 of 780 nm and that of 950 nm.

Figure 9:
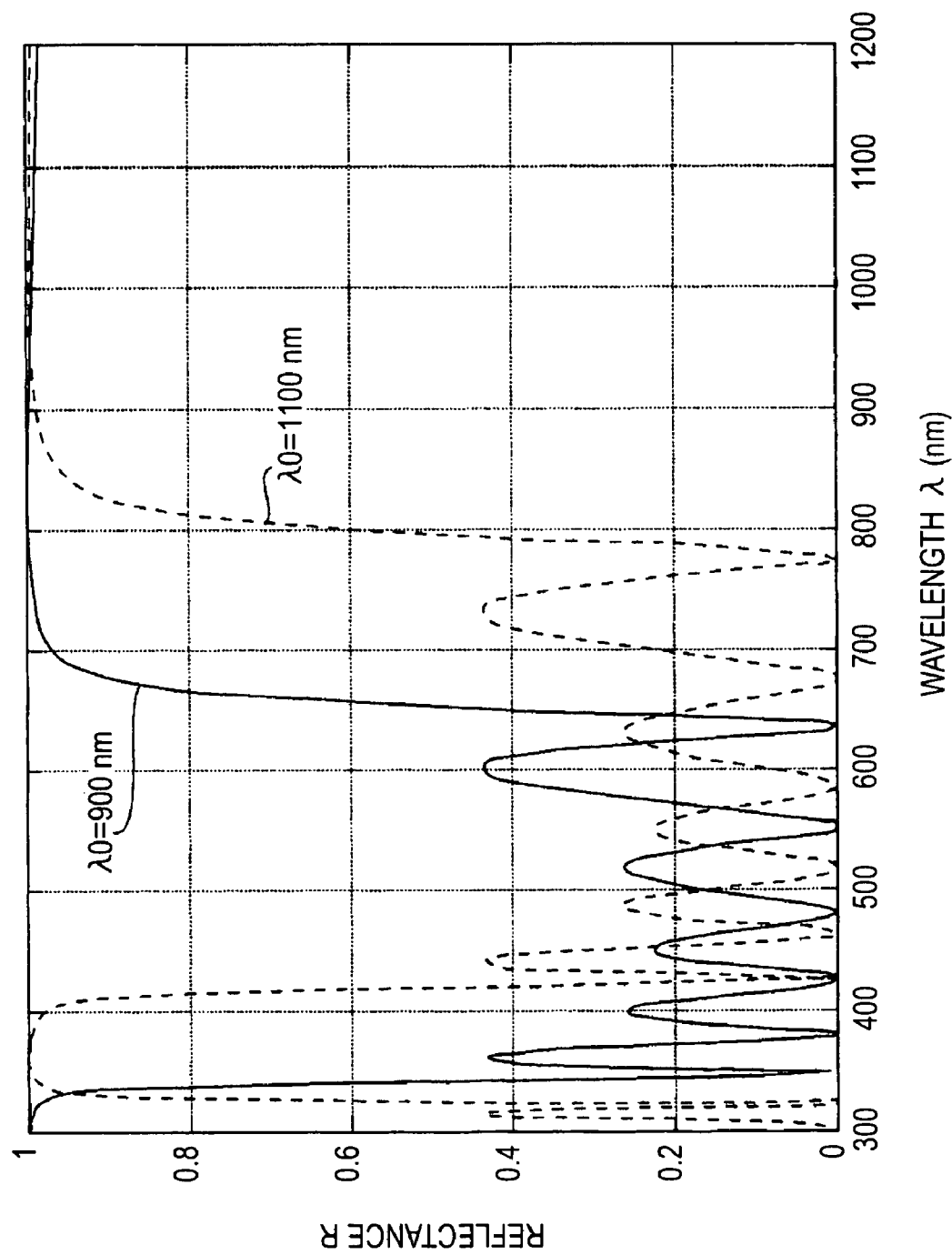
FIG. 9 is a graph showing reflection spectra illustrating the condition of a reflection central wavelength $\lambda$.

In addition, as described above, when the multilayered film is made of Si/SiO$_2$ (difference Δn in refractive index being 2.64), and when the central wavelength λ0 is in the range of 900 to 1,100 nm as reflection spectra shown in FIG. 9, the above conditions are almost satisfied.

Accordingly, in combination of silicon oxide SiO$_2$ with silicon nitride SiN and silicon Si, it may be acceptable when the reflection central wavelength λ0 satisfies the following equation (3-1). Preferably, the following equation (3-2) is satisfied. These equations mean that the reflection central wavelength λ0 is ideally set around 900 nm.

$$780 \text{ nm} \leq \lambda 0 \leq 1100 \text{ nm} \quad (3\text{-}1)$$

$$850 \text{ nm} \leq \lambda 0 \leq 1000 \text{ nm} \quad (3\text{-}2)$$

Of course, the materials described above are merely examples, and the effect described above is not only limited to the combination between a silicon oxide SiO$_2$ layer and a silicon nitride SiN layer. It is estimated by calculation that when materials are selected to obtain a difference in refractive index of 0.3 or more and preferably 0.5 or more, an effect similar to that described above can be obtained.

For example, the SiN film may have variation in composition to a certain extent which is caused by formation conditions. In addition, as the dielectric layer 1_j forming the dielectric laminate film 1, besides silicon oxide SiO$_2$ and silicon nitride SiN, there may be used oxides such as alumina Al$_2$O$_3$, zirconia ZrO$_2$ (refractive index: 2.05), titanium dioxide TiO$_2$ (refractive index: 2.3 to 2.55), magnesium oxide MgO, and zinc oxide ZnO (refractive index: 2.1); high molecular weight materials such as polycarbonate PC (refractive index: 1.58) and an acrylic resin PMMA (refractive index: 1.49); and semiconductor materials such as silicon carbide SiC (refractive index: 2.65) and germanium Ge (refractive index: 4 to 5.5).

When a high molecular weight material is used, the spectral filter 10 can be formed so as to have properties which may not be obtained from a glass. That is, by using a plastic, a light-weight spectral filter having superior durability (high temperature, high humidity, and impact resistance) can be formed.

<<Spectral Image Sensor Using Dielectric Laminate Film>>

FIGS. 10 to 14 are views illustrating one embodiment of a spectral image sensor 11 suitably applied to the image sensor 122 using the dielectric laminate film 1. This spectral image sensor 11 is formed by a basic method for designing the spectral filter 10 using the dielectric laminate film 1. In this embodiment, a design example of the spectral image sensor 11 will be described in which the dielectric laminate film 1 which selectively reflects the infrared light IR is provided on a semiconductor element layer so as to receive a visible light VL component while the infrared light IR is cut.

The basic structure of the spectral image sensor 11 contains a semiconductor element layer and the spectral filter 10 provided on a light-receiving portion thereof. Only by this basic structure described above, a spectral image sensor used for single-wavelength separation (that is, for image-taking of a monochrome image) is formed; however, when predetermined colors (for example, R, G, and B) of color separation filters are provided at respective light-receiving portions of the spectral image sensor 11, a spectral image sensor used for image-taking of a color image can be formed.

When the dielectric laminate film 1 described with reference to FIGS. 4 to 6 is formed on a semiconductor element layer provided with a detection element such as a silicon (Si) photodetector and having a refractive index larger than that of each layer 1_j forming the dielectric laminate film 1, the distance from the semiconductor element layer to the dielectric laminate film 1, that is, the thickness dk of a silicon oxide SiO$_2$ layer forming the k-th layer, that is, the dielectric layer 1_k, is important.

Figure 10:
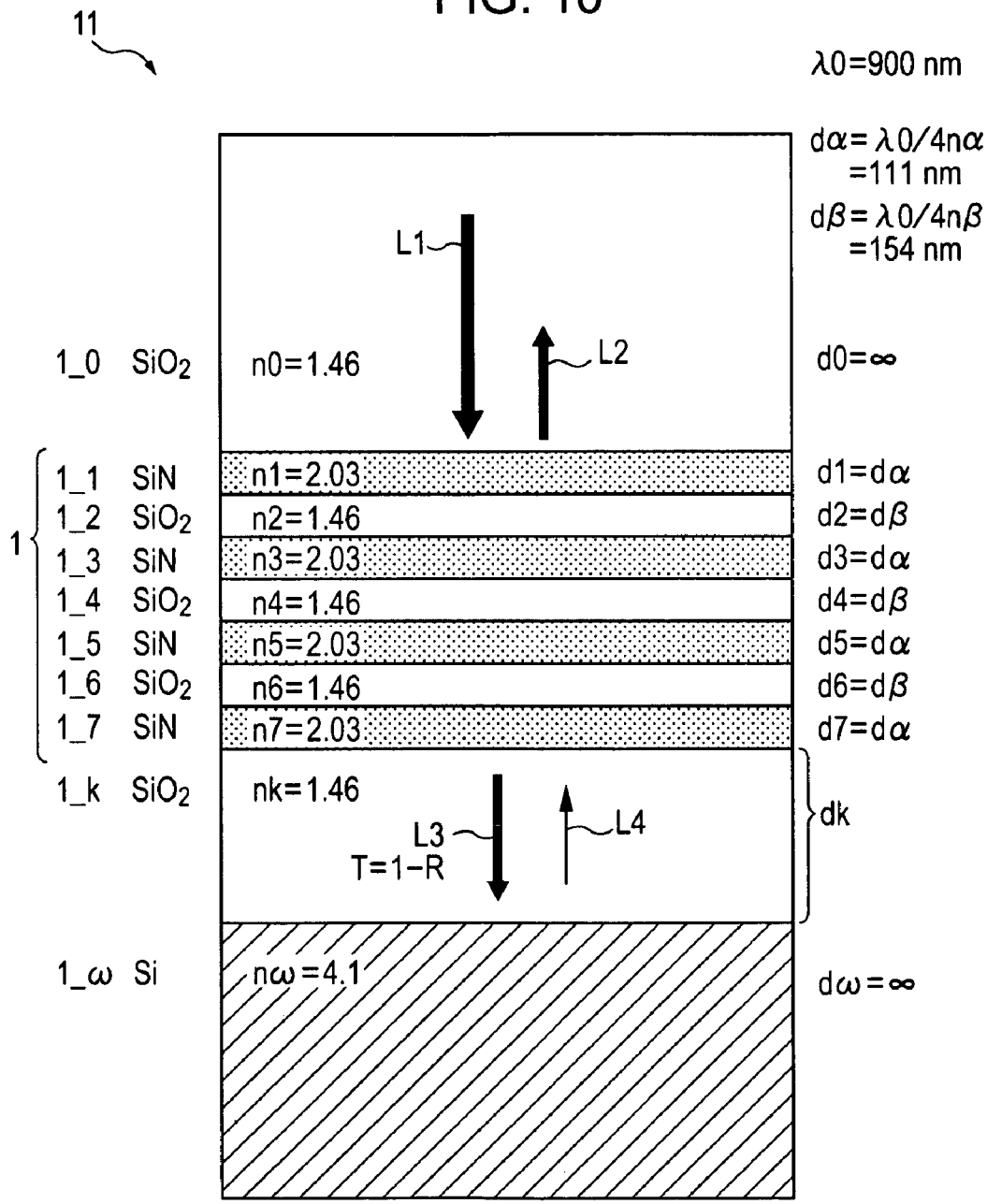
FIG. 10 shows a schematic structure of a spectral image sensor for single-wavelength separation using a laminate film according to the first embodiment.

As shown in the structure in FIG. 10, it means that by an interference effect with reflected light L4 from the surface of a silicon substrate 1_ω, that is, from the surface of the semiconductor element layer (such as photodetector) made of silicon Si (refractive index: 4.1), the spectrum of a total reflected light LRtotal is changed.

Figure 11:
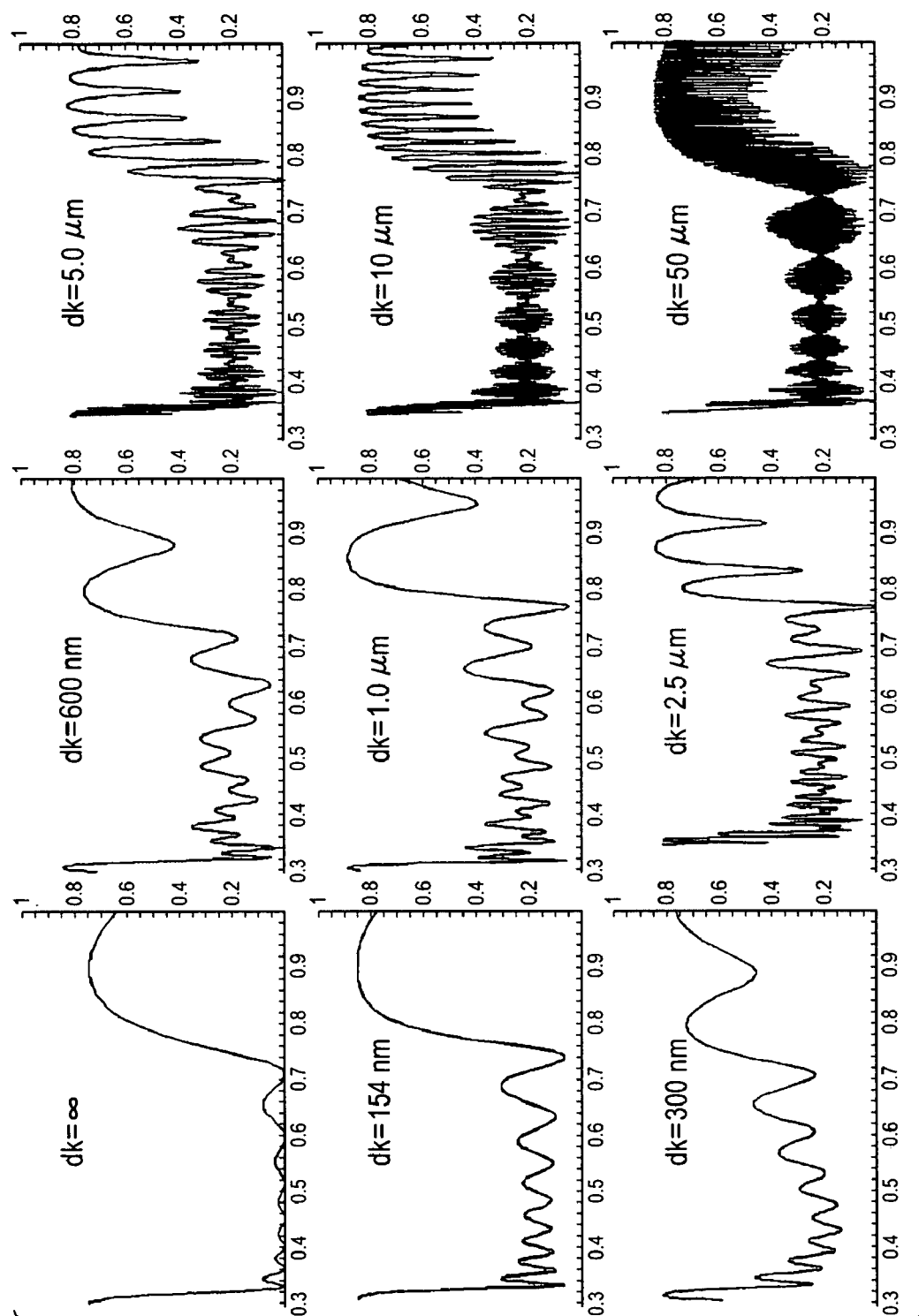
FIG. 11 includes graphs showing reflection spectra of a spectral image sensor for single-wavelength separation using a laminate film according to the first embodiment.

FIG. 11 includes views of reflection spectra for illustrating the relationship between the total reflected light LRtotal and the thickness dk of a silicon oxide SiO$_2$ layer forming the dielectric layer 1_k. In this case, the dielectric laminate film 1 having a seven-layered structure shown in FIG. 4 is used, and the results are obtained by calculation while the thickness dk of the dielectric layer 1_k is changed. In each view shown in FIG. 11, the horizontal axis and the vertical axis represent the wavelength λ (μm) and the reflectance R, respectively.

As apparent from the views in FIG. 11, when the dk is 0.154 μm, that is, when the thickness satisfies the conditional equation (1) which relates to the reflection central wavelength λ0 of the infrared light IR, it is understood that the reflection spectrum is not substantially influenced and that the infrared light IR (wavelength λ: 780 nm or more) is strongly reflected. On the other hand, in spectra at a thickness dk in the range of 0.3 to 50 μm, it is understood that compared to a reflection spectrum obtained when the thickness dk is infinite, other oscillations are generated. Hence, it is understood that a wavelength region is present in which infrared reflection is decreased in the form of a dip.

However, since the half width of the dip in the infrared region is 30 nm or less when the thickness dk is 2.5 μm or more, and in particular, since the half width of the dip is decreased to 20 nm or less when the thickness dk is 5.0 μm or more, the half width is sufficiently decreased relative to general, broad, natural light, and hence an averaged reflectance is obtained. Furthermore, from the spectra obtained when the thickness dk is 0.3 to 1.0 μm, it is also understood that the reflectance in the visible light VL region is high. As a result, the thickness dk is preferably approximately 0.154 μm, that is, the value that satisfies the equation (1) is most suitable.

Figure 12:
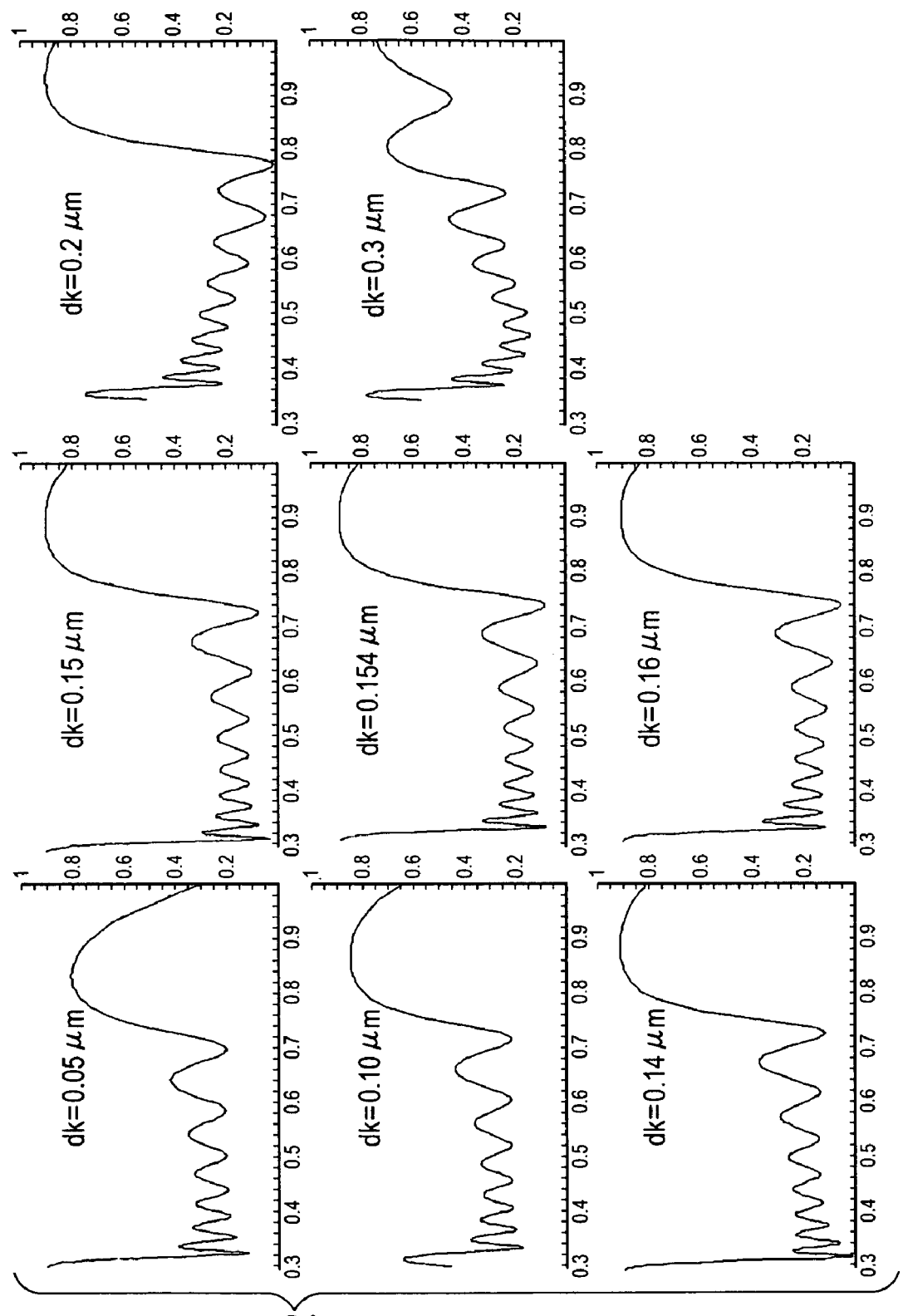
FIG. 12 includes graphs showing detailed reflection spectra of a spectral image sensor for single-wavelength separation using a laminate film according to the first embodiment.

FIG. 12 includes views of reflection spectra for illustrating the relationship between the reflectance R and the thickness dk of a silicon oxide SiO$_2$ layer forming the dielectric layer 1_k. In particular, the results are shown which are obtained by changing the thickness dk at around 0.154 μm. In each view shown in FIG. 12, the horizontal axis and the vertical axis represent the wavelength λ (μm) and the reflectance R, respectively.

As can be seen from the results, it is understood that when the thickness dk is in the range of 0.14 to 0.16 μm which is centered at 0.154 μm at which the conditional equation (1) is satisfied, reflection in the visible light VL region can be suppressed.

Figure 13:
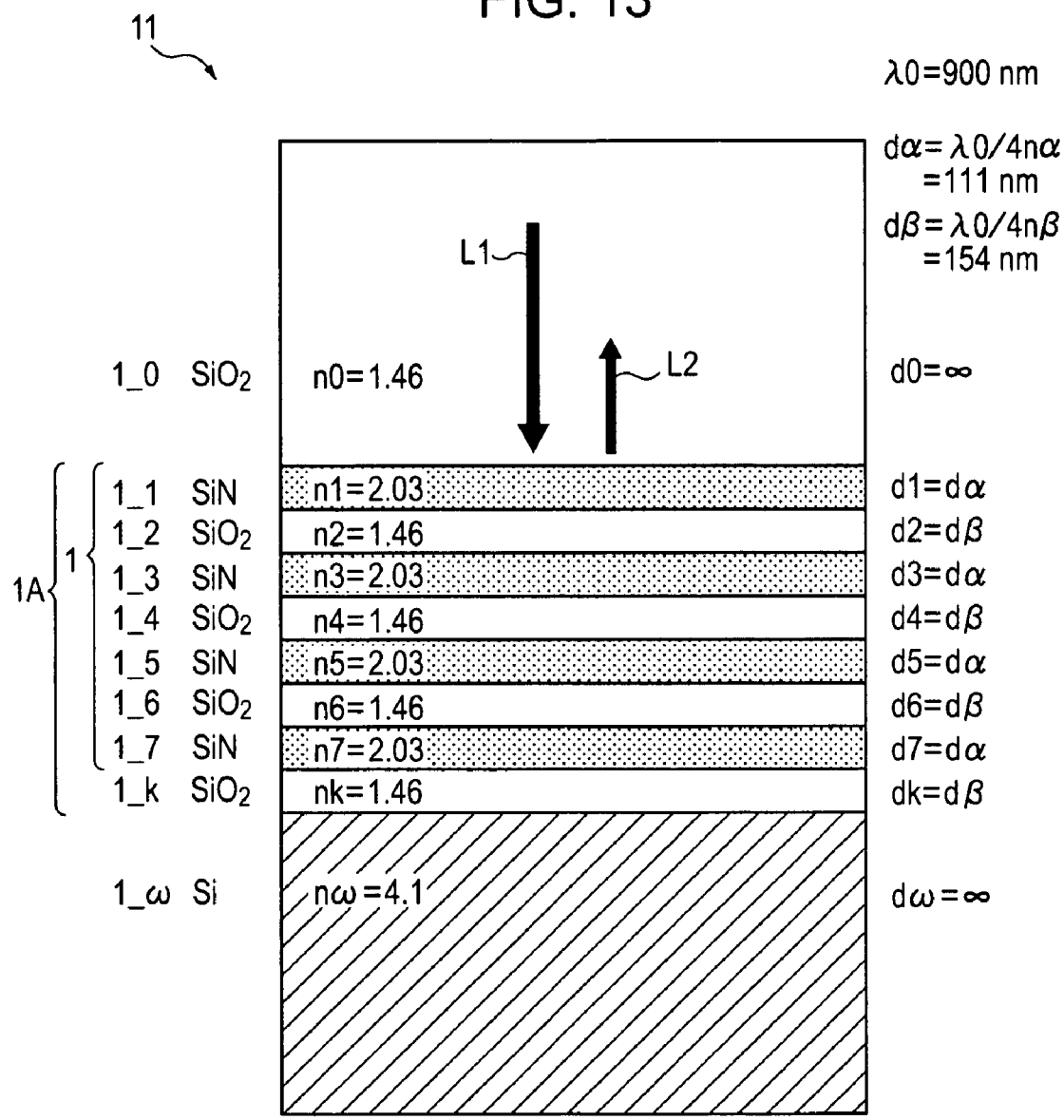
FIG. 13 is a schematic view illustrating the structure of a spectral image sensor for single-wavelength separation using a laminate film according to the first embodiment.
Figure 14:
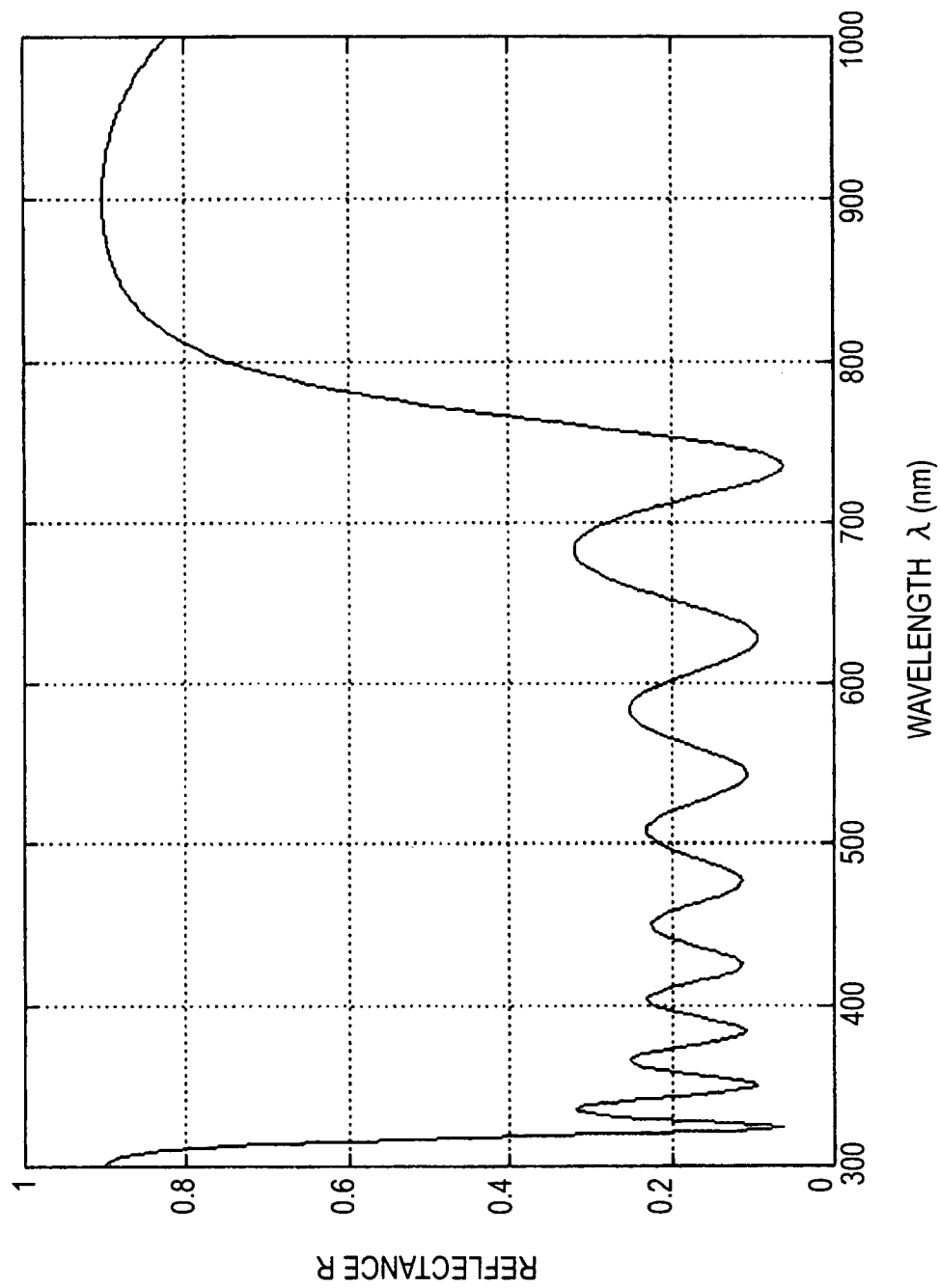
FIG. 14 is a graph showing a reflection spectrum illustrating a spectral image sensor for single-wavelength separation using a laminate film according to the first embodiment.

Accordingly, as shown in FIG. 13, the optimum structure of the spectral image sensor 11 practically has a dielectric laminate film 1A of an eight-layered structure including the dielectric layer 1_k, which is the k-th layer, and the results of the reflection spectrum obtained by calculation is as shown in FIG. 14. In other words, the dielectric laminate film 1A has the structure in which a layer made of silicon oxide $SiO_2$ used as the second layer material is periodically provided four times on a silicon substrate 1_ω.

<Modified Examples of Spectral Filter and Spectral Image Sensor>

FIGS. 15 to 19 are views showing modified examples of the spectral filter 10 and the spectral image sensor 11. The above spectral filter 10 has a basic structure using the dielectric laminate film 1, and in addition, various modifications can be made. In a manner similar to that described above, the above spectral image sensor 11 has a basic structure in which the spectral filter 10 using the dielectric laminate film 1 is formed on a light-receiving portion such as a CMOS or a CCD, and various modifications can also be made. For example, although details are omitted, as modified examples of the spectral filter 10 and the spectral image sensor 11, various structures may be used which are disclosed in Japanese Patent Application No. 2004-358139 proposed by the inventors of the present invention.

Figure 15:
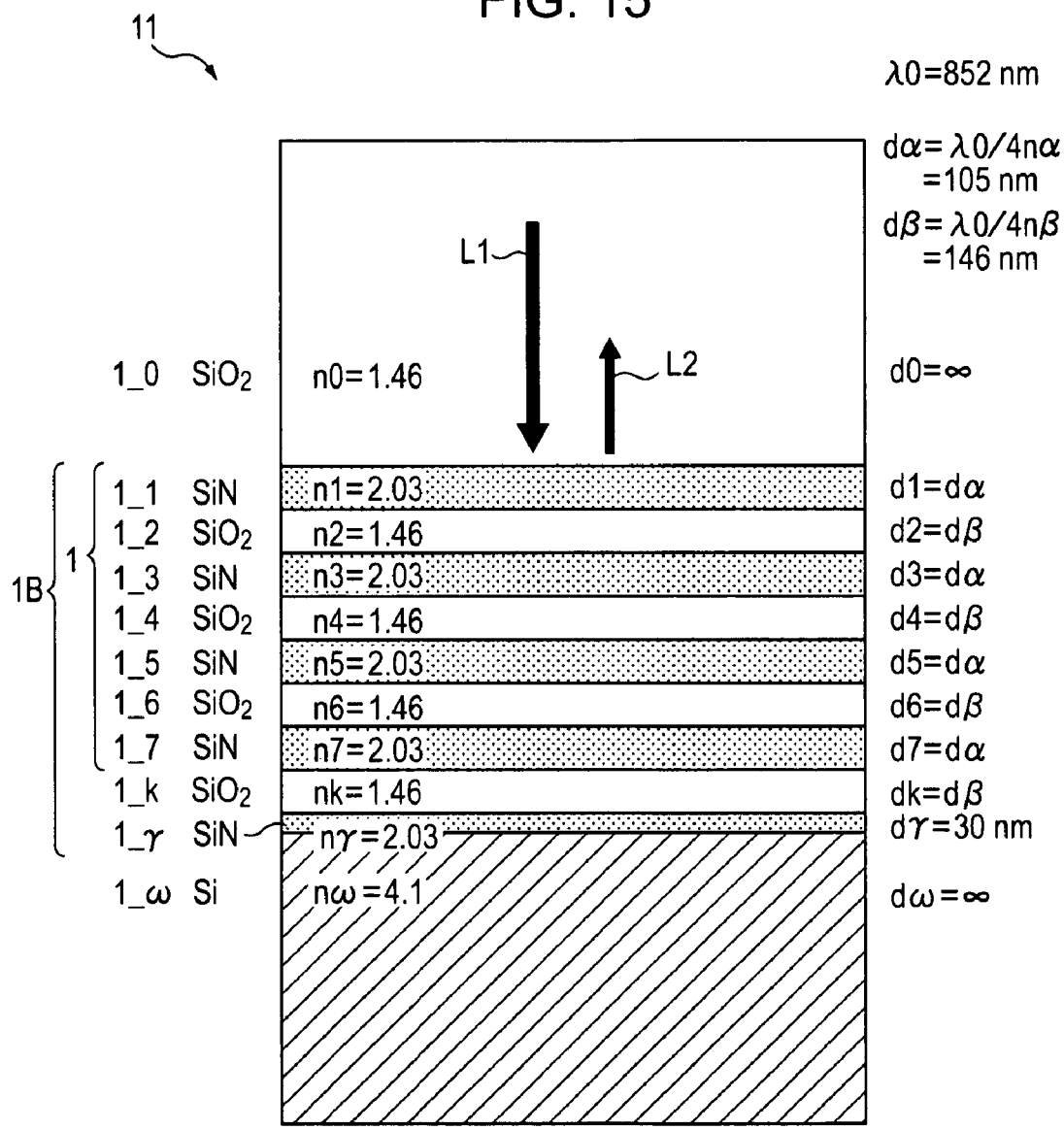
FIG. 15 is a schematic view illustrating the structure of a spectral image sensor for single-wavelength separation using a laminate film according to a second embodiment.

For example, as shown in FIG. 15, when the spectral image sensor 11 is formed in which between the dielectric layer 1_k and the silicon substrate 1_ω, a third layer 1_γ (such as a silicon nitride SiN layer) having an intermediate refractive index between the dielectric layer 1_k and the silicon substrate 1_ω is additionally provided, the reflection in the visible light region can also be decreased (hereinafter referred to as "the first modified example").

Figure 16:
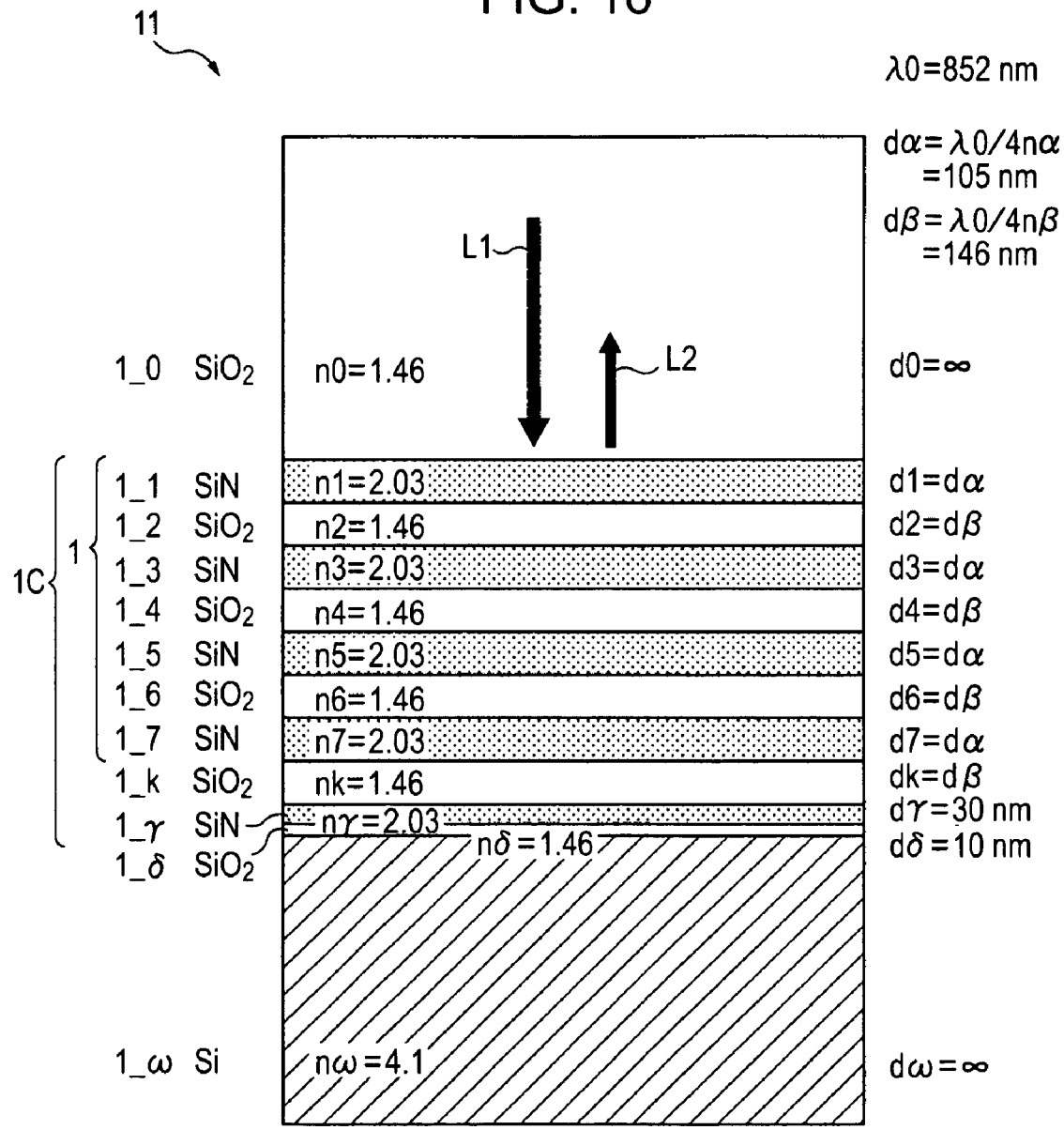
FIG. 16 is a schematic view illustrating the structure of a spectral image sensor for single-wavelength separation using a laminate film according to the second embodiment.

In addition, as shown in FIG. 16, when the spectral image sensor 11 is formed in which between the third layer 1_γ added in the first modified example and the silicon substrate 1_ω, a fourth layer 1_δ (such as a silicon oxide $SiO_2$ layer) having a refractive index smaller than that of the third layer 1_γ is provided, a dark current can be further decreased (hereinafter referred to as "the second modified example").

Figure 17:
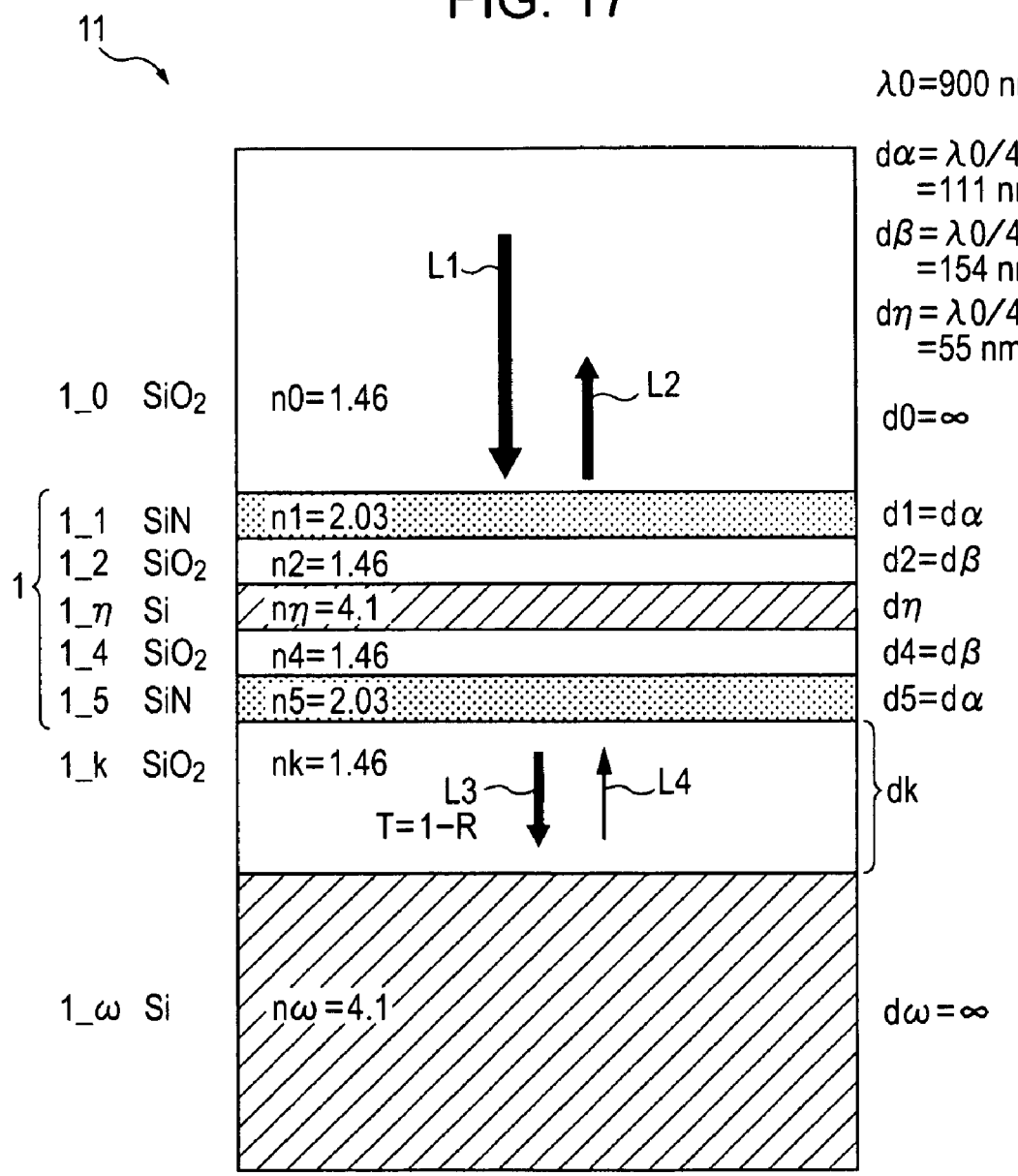
FIG. 17 is a schematic view illustrating the structure of a spectral image sensor for single-wavelength separation using a laminate film according to a third embodiment.

In addition, as shown in FIG. 17, when the spectral image sensor 11 is formed in which in the dielectric laminate film 1, a fifth layer 1_η (such as a silicon Si layer having a thickness dη of 61 nm and a refractive index of 4.1 which is higher than that of silicon nitride SiN and that of silicon oxide $SiO_2$) is additionally provided which has a refractive index higher than that of the basic first and second layer materials forming this dielectric laminate film 1, the number of the dielectric layers, a j-th layer represented by a dielectric layer 1_j, forming the dielectric laminate film 1 can be decreased (hereinafter referred to as "the third modified example").

Figure 18:
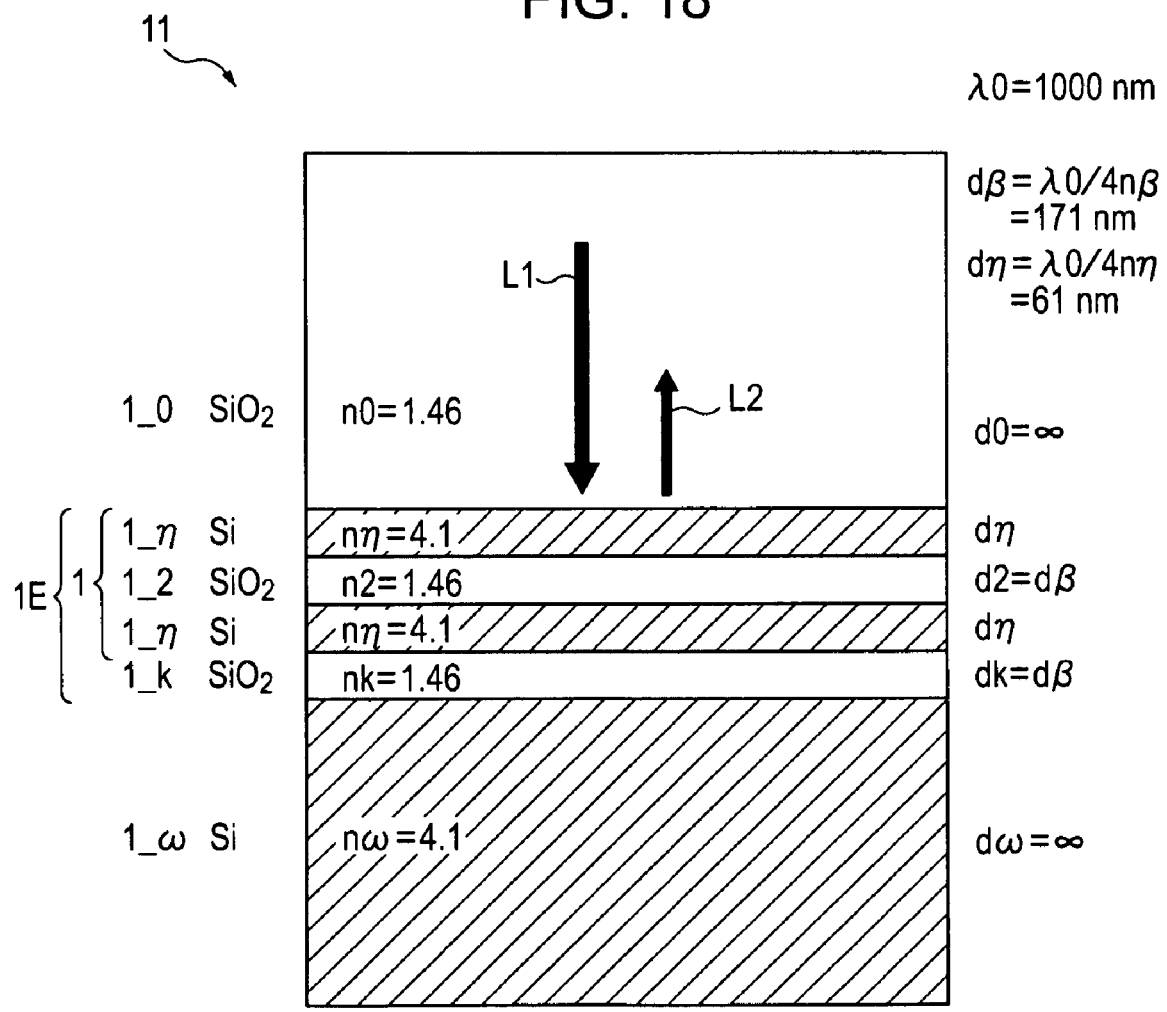
FIG. 18 is a schematic view illustrating the structure of a spectral image sensor for single-wavelength separation using a laminate film according to a fourth embodiment.

In addition, as shown in FIG. 18, in order to decrease the number of layers as described in the third modified example, when the spectral image sensor 11 is formed in which a plurality of fifth layers 1_η (such as a silicon Si layer having a thickness dη of 61 nm and a refractive index of 4.1 which is higher than that of silicon nitride SiN and that of silicon oxide $SiO_2$) is additionally provided, each of which has a refractive index higher than that of the basic first and second layer materials forming this dielectric laminate film 1, the number of layers can be further decreased (hereinafter referred to as "the fourth modified example").

The third and fourth modified examples of the spectral image sensor 11 can also be applied to the spectral filter 10.

In addition, as shown in FIG. 19, in the third and the fourth modified examples, when the first and the second modified examples are simultaneously applied to the spectral image sensor 11, besides the decrease in number of layers, the reflection in the visible light region can also be decreased. In particular, although the reflectance of a blue color B component (at a wavelength of approximately 420 nm) and that of a green color G component (at a wavelength of approximately 520 nm) are slightly increased, the reflectance of a red color R component (at a wavelength of approximately 600 nm) can be sufficiently decreased, and hence the visible light VL and the infrared light IR can be appropriately separated.

In the above description, the spectral image sensor 11 is formed of the spectral filter 10 using the dielectric laminate film 1; however, the image sensor is not limited thereto, and any image sensor may be used as long as a member having properties, which reflect a predetermined wavelength region component of an electromagnetic wave and which transmit the rest thereof, is provided at an incident surface side on which the electromagnetic wave is incident.

For example, besides the dielectric laminate film 1, by using a monolayer film having a predetermined thickness, a spectral filter can also be formed. The reason for this is that when the thickness of the monolayer film is changed, an effect can be obtained which reflects a predetermined wavelength region component of an electromagnetic wave and transmits the rest thereof. By this structure, the cost can be advantageously decreased as compared to that of the laminate film.

The above monolayer film is not only applied to the spectral image sensor 11 but can also be applied to the wavelength separation optical system 104, and the mirror 105 using a monolayer film having a predetermined thickness can be applied to the wavelength separation optical system 104.

Second Embodiment

Figure 20A:
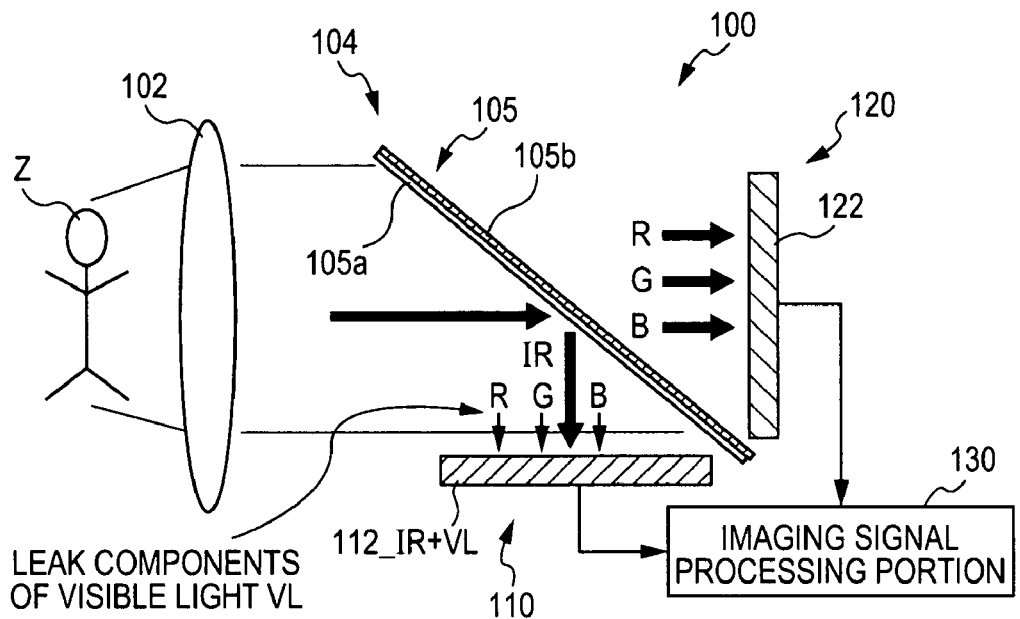
FIGS. 20A and 20B are schematic views showing the structure of an imager of the second embodiment according to the present invention.
Figure 20B:
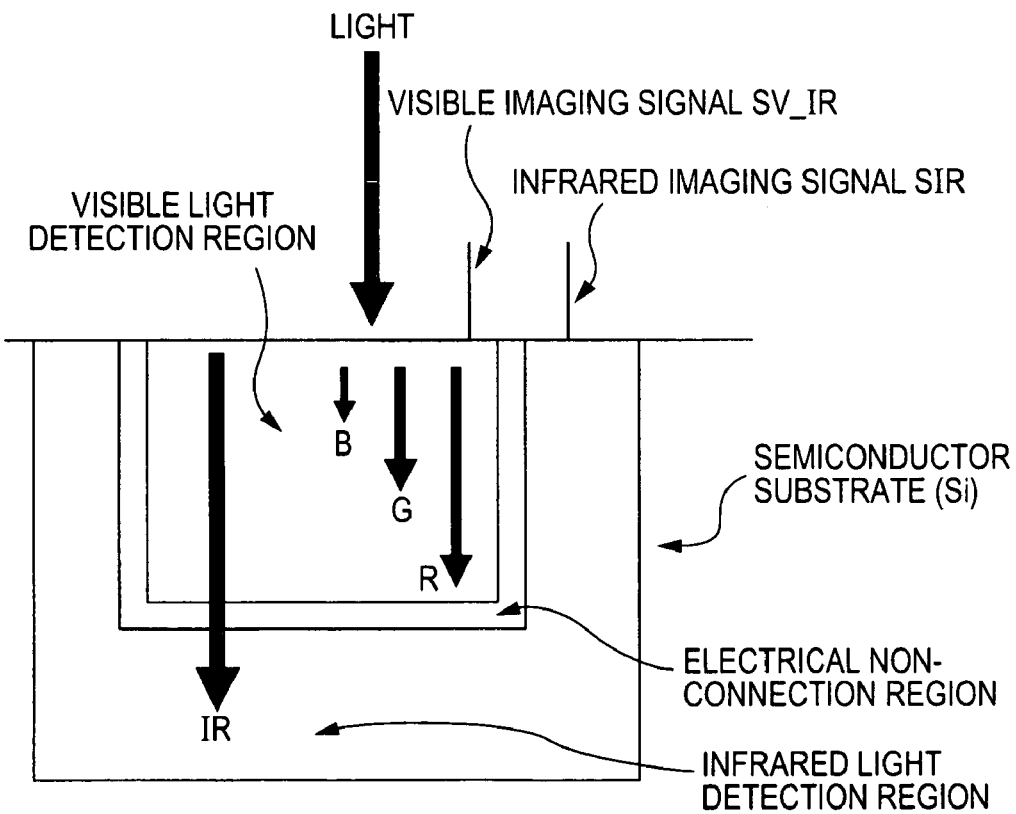

FIGS. 20A and 20B are schematic views showing the structure of an imager of a second embodiment according to the present invention. The imager 100 of the second embodiment is the same as that of the first embodiment in which the visible color image and the near-infrared image are independently obtained; however, as shown in FIG. 20A, in the imager of this embodiment, the infrared image-taking portion 110 includes the image sensor 112 optimized to detect the infrared light IR. The imaging signal processing portion 130 separates the visible light VL component and the infrared light IR component by calculation processing using a signal obtained from the infrared image-taking portion 110 and a signal obtained from the visible image-taking portion 120.

At the visible image-taking portion 120 side, the image sensor 122 may not be always necessary to be equivalent to the spectral image sensor 11 which is formed so as not to detect the infrared light IR. As shown in the figure, the image sensor 122 may detect the infrared light IR component besides the visible light VL component. Of course, it is more preferable when the image sensor 122 be equivalent to the spectral image sensor 11 which is formed so as not to detect the infrared light IR.

In particular, in the second embodiment, as shown in the structure of one pixel in FIG. 20B, as the measures in the case in which the visible light VL component leaks to the infrared light IR detection side, an image senor 112_IR+VL is used for the infrared image-taking portion 110, the image sensor 112_IR+VL being optimized to detect the infrared light IR and having the structure in which a visible image and an infrared image are separately obtained by using the difference in position of light absorption in the depth direction of a semiconductor between wavelengths. That is, by using the difference in position of light absorption in the depth direction of a semiconductor between wavelengths, the image sensor 112_IR+VL is used which can detect a wavelength component (the infrared light IR component in this case) to be detected while influence of a wavelength component (the visible light VL component in this case) other than that to be detected is suppressed.

Accordingly, while not being substantially influenced by the visible light VL, the infrared image can be independently obtained. In addition, as an additional effect, a visible image can be obtained in a shallow region below the surface of the semiconductor, and when components of this visible image are synthesized with the visible image obtained by the image sensor 122 of the visible image-taking portion 120, the sensitivity can be improved.

For example, when the infrared light IR is separated by reflection in the wavelength separation optical system 104 to the infrared image-taking portion 110 side, a light component thus separated to the infrared light side depends on the separation capability of the wavelength separation optical system 104, and although the light component is primarily composed of the infrared light IR, several percent of the visible light VL is still contained.

Hence, in the second embodiment, the image sensor 112_IR+VL is used which has the structure using the difference in position of light absorption in the depth direction of a semiconductor substrate between wavelengths. As one example, electrons photoelectrically converted by the visible light VL having a wavelength of less than 780 nm are absorbed in a silicon Si substrate at a relatively small distance, such as approximately 5 μm, in the depth direction from the surface thereof. The remaining light component, that is, electrons photoelectrically converted by the infrared light IR having a wavelength of 780 nm or more are absorbed in a region deeper than 5 μm. At the boundary between the detection regions for the above two types of electrons, an electrical non-connection region is provided. When the structure is formed in which a signal obtained in the region deeper than 5 μm is detected, an electrical signal only made of the infrared light IR component can be obtained.

That is, when signal components of the visible light VL (such as a wavelength of less than 780 nm) which are photoelectrically converted in the shallow region are excluded, and when the component of the infrared light IR (such as a wavelength of 780 nm or more) which is photoelectrically converted in the deep region of the semiconductor layer is only used, electrical signal only made of the incident infrared light IR component is obtained. Hence, in the infrared image-taking portion 110, the infrared image can be obtained which is not substantially influenced by the visible light VL.

Accordingly, only photoelectrons of the incident visible light VL component are converted into a visible imaging signal SV_IR so that a visible image is obtained which is not substantially influenced by the infrared light IR, and in addition, only photoelectrons of the incident infrared light IR component are converted into an infrared imaging signal SIR, so that the infrared image can be independently and simultaneously obtained which is not substantially influenced by the visible light VL.

Of course, when the structure is formed so that a signal obtained in a region located at a relatively small distance, such as approximately 5 μm, from the surface of the substrate is detected, an electrical signal of a visible light VL component can also be obtained by the image sensor 112. Incidentally, as is the case of the related technique described above, when passing through the region in which the visible light VL is detected, the infrared light IR is absorbed to a certain extent, and an infrared light IR component thus absorbed is mistakenly detected as the visible light VL; hence, as a result, the visible light VL is influenced by the infrared light IR component.

Hence, in the infrared image-taking portion 110, signal components GV_IR of the visible light VL (such as a wavelength of less than 780 nm) which are photoelectrically converted in the shallow region below the surface of the semiconductor layer and a signal component GIR of the infrared light IR (such as a wavelength of 780 nm or more) which is photoelectrically converted in the deep region of the semiconductor layer can also be separated and detected. Accordingly, the image sensor 112_IR+VL for the infrared light IR can also be practically used as an image sensor used for both the infrared light IR and visible light VL.

In this embodiment, the leak of the visible light VL component to the infrared image-taking portion 110 indicates that the visible light VL component at the visible image-taking portion 120 side is decreased thereby, and that as the visible imaging signal SV obtained in the image sensor 122, light-receiving sensitivity of the visible image is decreased.

Hence, when the visible imaging signal SV_IR obtained by the image sensor 112_IR+VL at the infrared image-taking portion 110 side and the visible imaging signal SV obtained by the image sensor 122 are synthesized in the imaging signal processing portion 130, the decrease caused by the leak to the infrared image-taking portion 110 side can be corrected, and hence the sensitivity of the visible image can be improved.

In addition, even when the image sensor 112_IR+VL is used having the structure in which the difference in position of light absorption in the depth direction of a semiconductor between wavelengths is used, a wavelength of the infrared light IR and a wavelength of the red color component of the visible light VL, which are detected around the boundary therebetween, are influenced with each other to a certain extent through the absorption.

Hence, in the imaging signal processing portion 130, when the infrared imaging signal SIR obtained by the image sensor 112_IR+VL is corrected (for example, by difference processing) using the visible imaging signal SV_IR obtained by the image sensor 112_IR+VL at the infrared image-taking portion 110 side, the influence of the red color component in the visible light VL can also be suppressed.

Third Embodiment

FIGS. 21A, 21B and 21C are schematic views showing the structure of an imager of the third embodiment according to the present invention. The imager 100 of the third embodiment is the same as that of the first and the second embodiments in which the visible color image and the near-infrared image are independently obtained; however, as shown in FIG. 21A, in the imager of this embodiment, the infrared image-taking portion 110 is provided with the image sensor 112 optimized to detect the infrared light IR, and the visible image-taking portion 120 is also provided with the image sensor 122 optimized to detect the visible light VL. That is, the structure of this embodiment is formed in combination of the first embodiment and the second embodiment. The imaging signal processing portion 130 separates the visible light VL component and the infrared light IR component by calculation processing using a signal obtained from the infrared image-taking portion 110 and a signal obtained from the visible image-taking portion 120.

In the third embodiment, as shown by the structure of one pixel in FIG. 21B, as the measures in the case in which the visible light VL component leaks to the infrared light IR detection side, in a manner similar to that of the second embodiment, the image senor 112_IR+VL is used for the infrared image-taking portion 110, the image sensor being optimized to detect the infrared light IR and having the structure in which a visible image and an infrared image are separately obtained by using the difference in position of light absorption in the depth direction of a semiconductor between wavelengths.

In addition, unlike the case of the first embodiment, as the measures in the case in which an infrared light IR component leaks to the visible light VL detection side, an image senor 122_VL+IR is used at the visible image-taking portion 120 side, the image sensor being optimized to detect the visible light VL and having the structure in which a visible image and an infrared image are separately obtained by using the difference in position of light absorption in the depth direction of a semiconductor between wavelengths. That is, by using the difference in position of light absorption in the depth direction of a semiconductor between wavelengths, the image sensor 112_VL+IR is used which can detect a wavelength component (the visible light VL component in this case) which is to be detected while influence of a wavelength component (the infrared light IR component in this case) other than that to be detected is suppressed.

In particular, as shown by the structure of one pixel in FIG. 21C, an image sensor having the same structure as that shown in FIG. 21B is used, and on the light-receiving surface thereof, predetermined colors (such as 124R, 124G, and 124B) of color separation filers 124 are provided for respective light-receiving portions (pixels), so that image-taking of a color image can be performed.

By the structure as described above, at the visible image-taking portion 120 side, when a signal component of the infrared light IR (such as a wavelength of 780 nm or more) which is photoelectrically converted in a deep region of the semiconductor layer is excluded, and when components of the visible light VL (such as a wavelength of less than 780 nm) which are photoelectrically converted in a shallow region below the surface of the semiconductor layer are only used, electrical signals only made of the incident visible light VL component are obtained for the respective colors. Hence, in the visible image-taking portion 120, the visible image can be obtained which is not substantially influenced by the infrared light IR.

Accordingly, only photoelectrons of the incident visible light VL component are converted into the visible imaging signal SV_IR so as to obtain a visible image which is not substantially influenced by the infrared light IR, and in addition, only photoelectrons of the incident infrared light IR component are converted into the infrared imaging signal SIR, so that the infrared image which is not substantially influenced by the visible light VL can be simultaneously and independently obtained.

In addition, in the visible image-taking portion 120, a signal component GIR of the infrared light IR (such as a wavelength of 780 nm or more) which is photoelectrically converted in the deep region of the semiconductor layer and signal components GV_IR for respective colors of the visible light VL (such as a wavelength of less than 780 nm) which are photoelectrically converted in the shallow region below the surface of the semiconductor layer can be separated and detected. Accordingly, the image sensor 122_VL+IR for the visible light VL can also be practically used as an image sensor used for both the infrared light IR and visible light VL.

In this embodiment, the leak of the infrared light IR component to the visible image-taking portion 120 indicates that the infrared light IR component at the infrared image-taking portion 110 side is decreased thereby, and that as the infrared imaging signal SIR obtained in the image sensor 112, light-receiving sensitivity of the infrared image is decreased.

Hence, when the infrared imaging signal SIR obtained by the image sensor 112_IR+VL at the infrared image-taking portion 110 side and an infrared imaging signal SIR_VL obtained by the image sensor 122_VL+IR are synthesized in the imaging signal processing portion 130, the decrease caused by the leak to the visible image-taking portion 120 side can be corrected, and hence the sensitivity of the infrared image can be improved.

In addition, even when the image sensor 112_VL+IR is used having the structure in which the difference in position of light absorption in the depth direction of a semiconductor between wavelengths is used, a wavelength of the infrared light IR and a wavelength of the red color component of the visible light VL, which are detected around the boundary therebetween, are influenced with each other to a certain extent through the absorption.

Hence, in the imaging signal processing portion 130, when the visible imaging signal SV (particularly the red color component) obtained by the image sensor 122_VL+IR is corrected (for example, by difference processing) using the infrared imaging signal SIR_VL obtained by the image sensor 122_VL+IR at the visible image-taking portion 120 side, the influence of the infrared light IR component can be suppressed.

<Signal Reading Method>

Figure 22A:
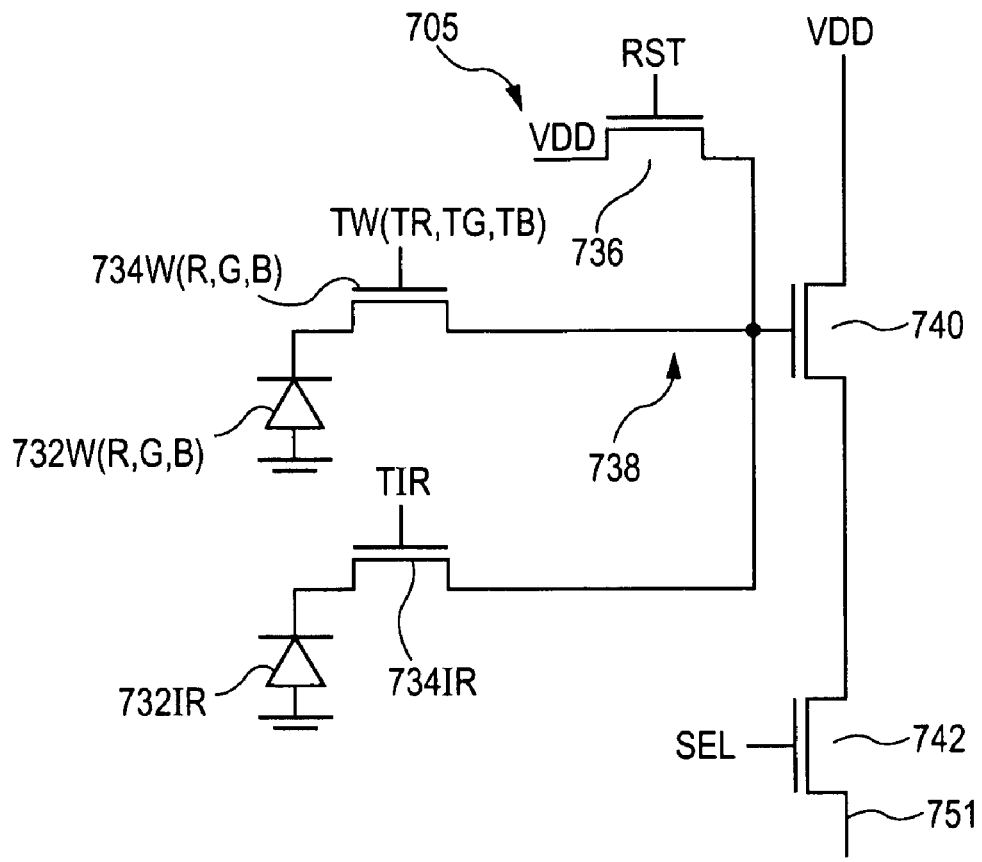
FIGS. 22A and 22B are schematic views showing one example of a signal acquisition method of the second and the third embodiments according to the present invention.
Figure 22B:
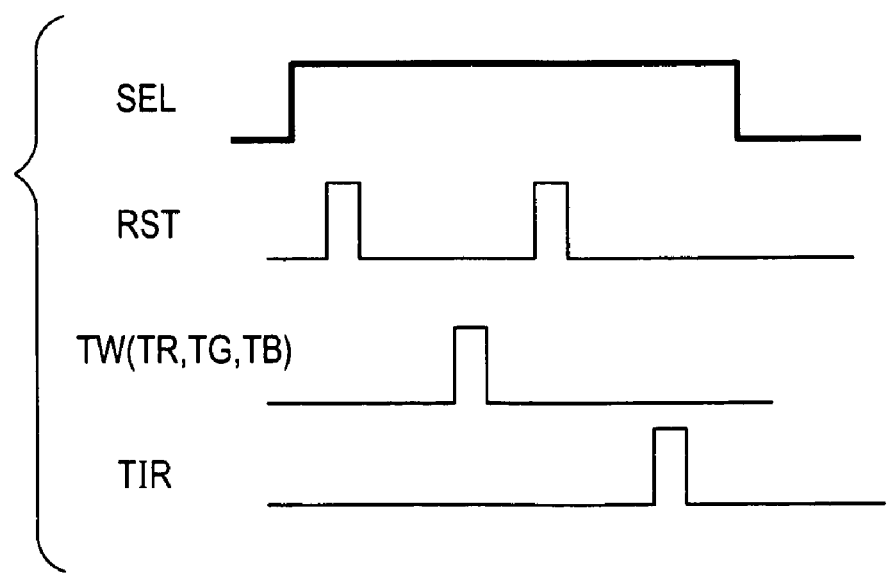

FIGS. 22A and 22B are views showing an example of a signal reading method using the image sensors 112_IR+VL and 122_VL+IR used in the second and the third embodiment, each image sensor having the structure in which the visible image and the infrared image are separately obtained using the difference in position of light absorption in the depth direction of a semiconductor between wavelengths. FIG. 22A shows a circuit diagram, and FIG. 22B shows a signal timing diagram.

For photoelectric transducers 732W (in monochrome imaging; in color imaging, for respective colors, R, G, and B, hereinafter, the same description will be omitted) and 732IR, transfer gates 734W (or R, G, and B) and 734IR for respective wavelengths are provided, respectively. The photoelectric transducers 732W (or R, G, and B) and 732IR are connected to an amplifier 705 in a pixel through the respective transfer gates 734W (or R, G, and B) and 734IR, the amplifier 705 including an amplifier transistor 740 and a reset transistor 736. The amplifier transistor 740 is connected to a vertical signal line 751 via a vertical selection transistor 742.

In accordance with respective timing diagrams shown in FIG. 22B which indicates the reset state and the signal reading state, a pixel signal is output. In the state in which a selection pulse SEL is being supplied to the vertical selection transistor 742 in a vertical line which is to be read, before reading pulses TW (or R, G, and B) and TIR are supplied to the transfer gates 734W (or R, G, and B) and 734IR, respectively, for reading respective signal charges, a reset pulse RST is supplied to the reset transistor 736, so that a floating diffusion 738 is reset. By the above steps, in the order (or may be opposite to that) from the infrared light IR component to the visible light VL component (entire visible light component or respective color components), pixel signals can be independently read.

Although the embodiments of the present invention have thus been described, the technical scope of the present invention is not limited thereto. Without departing from the spirit and the scope of the present invention, the embodiments described above may be variously modified or improved, and embodiments thus modified or improved are also included in the technical scope of the present invention.

In addition, the aspects of the present invention are not limited to the embodiments described above, and it is not necessary that all the combinations of the characteristics described in the above embodiments be included in the solving means described in the specification. The above embodiments include the aspects of the present invention on various stages, and when the disclosed constituent elements are appropriately used in combination, various aspects of the present invention can be extracted. Even when some constituent elements of all the constituent elements described in the embodiments are deleted, as long as the above effect can be obtained, the structure formed without using the above some constituent elements can also be extracted as one aspect of the present invention.

For example, the above-described techniques are not limited to a technique in which visible light and infrared light are separated and in which a visible image and an infrared image are separately obtained by independently detecting the above separated light components. For example, visible light and ultraviolet light can be separated and can be detected, and ultraviolet light can be simultaneously detected together with visible light and can be formed into an image. In addition, as for the visible light which is simultaneously detected, in addition to detection of a monochrome image without performing wavelength separation, when the visible light region is separated, for example, into three primary color components using respective color filters as described above, a color image can also be detected.

Hence, in addition to a visible image (a monochrome image or a color image) which can be seen by naked eyes, ultraviolet image information which is not seen by naked eyes can also be obtained. Accordingly, the above device will be widely used as a key device, such as an optical-synthesis monitoring camera, for a new information system.

For example, according to the above embodiments, in wavelength separation using the wavelength separation optical system 104, the infrared light IR is a reflection wavelength region component, and the visible light VL having a wavelength shorter than that of the infrared light IR is a transmission wavelength region component. However, by the wavelength separation optical system 104 using the dielectric laminate film 1 in which the visible light VL is handled as a reflection wavelength region component and light (such as ultraviolet light) having a wavelength shorter than the visible light VL is handled as a transmission wavelength region component, the visible light VL and the light (such as ultraviolet light) having a wavelength shorter than that of the visible light VL can be separated and detected.

It should be understood by those skilled in the art that various modifications, combinations, sub-combinations and alterations may occur depending on design requirements and other factors insofar as they are within the scope of the appended claims or the equivalents thereof.

What is claimed is:

1. An imager comprising:
    a first wavelength separation portion which substantially separates an electromagnetic wave carrying an image into at least a first wavelength component and a second wavelength component; and
    first and second image-taking portions detecting images of the respective first and second wavelength components, wherein at least the first image-taking portion has a first detecting part optimized to detect the first wavelength component and includes a second means for further filtering wavelength components other than said first wavelength component prior to detecting an image of said first wavelength component.

2. The imager according to claim 1, wherein the first wavelength separation portion comprises:
    a substrate having optical transparency to the electromagnetic wave; and
    one of a laminate member and a monolayer film, which is provided over the substrate, the laminate member being composed of layers which are laminated to each other and which have predetermined thicknesses, and
    wherein adjacent layers of the laminate member have different refractive indexes, whereby the separation portion reflects one wavelength of the electromagnetic wave and transmits another wavelength thereof.

3. The imager according to claim 1,
    wherein the second means for further filtering wavelength components comprises one of a laminate member and a monolayer film, which is provided over a surface of the first detecting part of the first image-taking portion at which the electromagnetic wave is first incident, the laminate member being composed of layers which are laminated to each other and which have predetermined thicknesses, and
    wherein adjacent layers of the laminate member have different refractive indexes.

4. The imager according to claim 3, wherein the second means for further filtering wavelength components comprises a semiconductor material that performs further wavelength separation based on differences in absorption of the semiconductor material between different wavelengths such that electromagnetic waves having a larger wavelength penetrate deeper into the semiconductor material before being attenuated than electromagnetic waves having a smaller wavelength, whereby the first detecting part detects said first wavelength component which is to be detected while influence of a second wavelength component other than said first wavelength component which is to be detected is suppressed.

5. The imager according to claim 4, wherein the first detecting part using the difference in position of light absorption in the depth direction of the semiconductor between wavelengths detects said first wavelength component which is to be detected in one region in the depth direction of the semiconductor and also detects the second wavelength component other than said first wavelength component which is to be detected in another region in the depth direction of the semiconductor different from the one region, and
    further comprising a signal processing portion which corrects a detection result of a third wavelength component detected by a detecting part of the second image-taking portion, based upon a detection result of the second wavelength component.

6. The imager according to claim 4, wherein the first detecting part using the difference in position of light absorption in the depth direction of the semiconductor between wavelengths detects said first wavelength component which is to be detected in one region in the depth direction of the semiconductor and also detects the second wavelength component which is to be detected in another region in the depth direction of the semiconductor different from the one region,
    further comprising a signal processing portion which corrects the detection result of said first wavelength component detected in said one region in the depth direction of the semiconductor based upon a detection result of the second wavelength component detected in said another region in the depth direction of the semiconductor.

7. An imaging device comprising:
a speetroscopic portion which separates incident light into transmitted light and reflected light depending on frequency of the incident light; and
an imaging area receiving the transmitted light and including a second means formed over the imaging area for further filtering wavelength components other than a desired wavelength component prior to detecting an image of the desired wavelength component,
wherein said spectroscopic portion includes a multilayer structure having refraction index distribution.

8. The imager of claim 1, further wherein the first wavelength separation portion is comprised of a plurality of alternating layers comprised primarily of SiO2 and SiN such that the first wavelength separation portion is comprised of at least a total of four layers, including two SiO2 layers and two SiN layers.

9. The imager of claim 3, further wherein the second means is comprised of a plurality of alternating layers comprised primarily of SiO2 and SiN such that the second means is comprised of at least a total of four layers, including two SiO2 layers and two SiN layers.

10. The imager according to claim 1, wherein the first detecting part comprises a semiconductor material and performs further wavelength separation based on differences in absorption of the semiconductor material between different wavelengths such that electromagnetic waves having a larger wavelength penetrate deeper into the semiconductor material before being attenuated than electromagnetic waves having a smaller wavelength, whereby the first detecting part detects said first wavelength component which is to be detected while influence of a second wavelength component other than said first wavelength component which is to be detected is suppressed.

11. The imager according to claim 10, wherein the first detecting part using the difference in position of light absorption in the depth direction of the semiconductor between wavelengths detects said first wavelength component which is to be detected in one region in the depth direction of the semiconductor and also detects the second wavelength component other than said first wavelength component which is to be detected in another region in the depth direction of the semiconductor different from the one region, and
further comprising a signal processing portion which corrects a detection result of a third wavelength component detected by a detecting part of the second image-taking portion, based upon a detection result of the second wavelength component.

12. The imager according to claim 10, wherein the first detecting part using the difference in position of light absorption in the depth direction of the semiconductor between wavelengths detects said first wavelength component which is to be detected in one region in the depth direction of the semiconductor and also detects the second wavelength component which is to be detected in another region in the depth direction of the semiconductor different from the one region,
further comprising a signal processing portion which corrects the detection result of said first wavelength component detected in said one region in the depth direction of the semiconductor based upon a detection result of the second wavelength component detected in said another region in the depth direction of the semiconductor.

13. The imager according to claim 1, wherein said first and second wavelength components are selected from the group elements consisting of visible light, ultraviolet light, and infrared light.

14. The imager according to claim 13, wherein said first and second wavelength components are selected from different group elements.

15. The imager according to claim 10, wherein said first and second wavelength components are selected from the group element consisting of visible light, ultraviolet light, and infrared light and wherein said first and second wavelength components are selected from different group elements.

16. The imager according to claim 1, wherein said second image-taking portion has a second detecting part optimized to detect the second wavelength component and includes a third means for further filtering wavelength components other than said second wavelength component prior to detecting an image of said second wavelength component.

17. The imager according to claim 16, wherein said first and second wavelength components are selected from the group elements. consisting of visible light, ultraviolet light, and infrared light and wherein said first and second wavelength components are selected from different group elements.

18. The imager according to claim 16, wherein the third means for further filtering wavelength components comprises one of a laminate member and a monolayer film, which is provided over a surface of the second detecting part of the second image-taking portion at which the electromagnetic wave is first incident, the laminate member being composed of layers which are laminated to each other and which have predetermined thicknesses, and
wherein adjacent layers of the laminate member have different refractive indexes.

19. The imager according to claim 18, wherein the second detecting part comprises a semiconductor material that performs further wavelength separation based on differences in absorption of the semiconductor material between different wavelengths such that electromagnetic waves having a larger wavelength penetrate deeper into the semiconductor material before being attenuated than electromagnetic waves having a smaller wavelength, whereby the second detecting part detects said second wavelength component which is to be detected while influence of a first wavelength component other than said first wavelength component which is to be detected is suppressed.

20. The imager according to claim 16, wherein the second detecting part comprises a semiconductor material that performs further wavelength separation based on differences in absorption of the semiconductor material between different wavelengths such that electromagnetic waves having a larger wavelength penetrate deeper into the semiconductor material before being attenuated than electromagnetic waves having a smaller wavelength, whereby the second detecting part detects said second wavelength component which is to be detected while influence of a first wavelength component other than said first wavelength component which is to be detected is suppressed.

* * * * *